(12) United States Patent
Atkins et al.

(10) Patent No.: US 8,369,092 B2
(45) Date of Patent: Feb. 5, 2013

(54) INPUT/OUTPUT AND DISK EXPANSION SUBSYSTEM FOR AN ELECTRONICS RACK

(75) Inventors: Robert G. Atkins, Poughkeepsie, NY (US); Philip M. Corcoran, Highland, NY (US); Edward J. Seminaro, Milton, NY (US); Jeffrey A. Verkerke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/767,853

(22) Filed: Apr. 27, 2010

(65) Prior Publication Data

US 2011/0261526 A1 Oct. 27, 2011

(51) Int. Cl.
*G06F 1/16* (2006.01)
*H05K 5/00* (2006.01)
*H05K 7/00* (2006.01)

(52) U.S. Cl. ........................................ 361/727; 361/730
(58) Field of Classification Search ................. 361/679.33–679.37, 724–731
See application file for complete search history.

(56) References Cited

U.S. PATENT DOCUMENTS

| | | | |
|---|---|---|---|
| 4,744,006 A | | 5/1988 | Duffield |
| 6,025,989 A | * | 2/2000 | Ayd et al. ........................ 361/695 |
| 6,137,684 A | * | 10/2000 | Ayd et al. ........................ 361/727 |
| 6,188,571 B1 | | 2/2001 | Roganti et al. |
| 6,456,498 B1 | * | 9/2002 | Larson et al. ................... 361/752 |
| 6,594,150 B2 | * | 7/2003 | Creason et al. ................. 361/727 |
| 6,785,133 B2 | * | 8/2004 | Barringer et al. .............. 361/694 |
| 6,863,557 B2 | | 3/2005 | Mills et al. |
| 6,976,111 B1 | | 12/2005 | Mills et al. |
| 7,193,847 B2 | * | 3/2007 | Liang et al. .................... 361/679.48 |
| 7,315,456 B2 | * | 1/2008 | Mondor et al. ................. 361/788 |
| 7,339,785 B2 | * | 3/2008 | Colborn et al. ............. 361/679.33 |
| 7,542,300 B1 | * | 6/2009 | Lui et al. ......................... 361/755 |
| 7,643,307 B2 | * | 1/2010 | Bosco et al. .................... 361/757 |

(Continued)

FOREIGN PATENT DOCUMENTS

JP 11-305874 A 11/1999

OTHER PUBLICATIONS

IBM Datasheet, "3U 16-Bay and 4U 24-Bay PCIe Expansion RAID Subsystem", (NA333A_NA380A_datasheet.pdf).

(Continued)

*Primary Examiner* — Jinhee Lee
*Assistant Examiner* — Adrian S Wilson
(74) *Attorney, Agent, or Firm* — Dennis Jung, Esq.; Kevin P. Radigan, Esq.; Heslin Rothenberg Farley & Mesiti P.C.

(57) ABSTRACT

An input/output (I/O) and disk expansion subsystem is provided for an electronics rack which provides expanded I/O and/or disk storage capabilities to electronic subsystems of the rack. The expansion subsystem includes a subsystem enclosure having first and second sides in opposing relation, with the first side accessible through a front of the rack and the second accessible through a back of the rack when the enclosure resides within the rack. A plurality of field-replaceable units reside within the subsystem enclosure, and are accessible and removable through the first or second sides of the enclosure without removing the enclosure from the rack. The field-replaceable units include an input/output adapter cage(s), a storage device cage, power and control supplies, fan assemblies, and a midplane connector assembly. The adapter cage, storage device cage, and power and control supply dock to and are electrically interconnected by the midplane connector assembly.

20 Claims, 20 Drawing Sheets

U.S. PATENT DOCUMENTS

| | | | |
|---|---|---|---|
| 7,804,690 B2 * | 9/2010 | Huang et al. | 361/724 |
| 7,944,700 B2 * | 5/2011 | Wang et al. | 361/727 |
| 8,116,075 B2 * | 2/2012 | Hall et al. | 361/679.33 |
| 8,144,458 B2 * | 3/2012 | Vinson et al. | 361/679.46 |
| 2003/0226676 A1 * | 12/2003 | Barringer et al. | 174/35 R |
| 2004/0062002 A1 * | 4/2004 | Barringer et al. | 361/687 |
| 2005/0190536 A1 | 9/2005 | Anderson et al. | |
| 2006/0050487 A1 * | 3/2006 | Wu et al. | 361/724 |
| 2006/0227474 A1 * | 10/2006 | Kelly et al. | 361/62 |
| 2006/0227525 A1 * | 10/2006 | Hoshino et al. | 361/796 |
| 2006/0277343 A1 | 12/2006 | Lin et al. | |
| 2007/0081315 A1 * | 4/2007 | Mondor et al. | 361/788 |
| 2007/0086172 A1 * | 4/2007 | Lai et al. | 361/727 |
| 2007/0121277 A1 * | 5/2007 | Lanus et al. | 361/600 |
| 2007/0121306 A1 * | 5/2007 | Moakes et al. | 361/788 |
| 2007/0223200 A1 * | 9/2007 | Fujiya et al. | 361/727 |
| 2007/0230111 A1 * | 10/2007 | Starr et al. | 361/685 |
| 2008/0037209 A1 * | 2/2008 | Niazi et al. | 361/683 |
| 2008/0043405 A1 * | 2/2008 | Lee et al. | 361/600 |
| 2008/0046617 A1 * | 2/2008 | Lee et al. | 710/104 |
| 2008/0165490 A1 * | 7/2008 | Buckland et al. | 361/685 |
| 2008/0253076 A1 * | 10/2008 | Chen | 361/684 |
| 2009/0002934 A1 * | 1/2009 | Carlson et al. | 361/684 |
| 2009/0086441 A1 * | 4/2009 | Randall et al. | 361/724 |
| 2009/0097200 A1 * | 4/2009 | Sharma et al. | 361/688 |
| 2009/0109619 A1 * | 4/2009 | Wise et al. | 361/695 |
| 2009/0190301 A1 * | 7/2009 | Huang et al. | 361/679.46 |
| 2009/0195978 A1 * | 8/2009 | Hu et al. | 361/679.48 |
| 2009/0257187 A1 * | 10/2009 | Mills et al. | 361/679.33 |
| 2009/0257188 A1 * | 10/2009 | Mills et al. | 361/679.49 |
| 2010/0217909 A1 * | 8/2010 | Pavol et al. | 710/301 |
| 2010/0265645 A1 * | 10/2010 | Wang et al. | 361/679.4 |
| 2010/0270897 A1 * | 10/2010 | Lin | 312/223.2 |
| 2011/0228475 A1 * | 9/2011 | Anderl et al. | 361/691 |

OTHER PUBLICATIONS

Jackson, P., "Why MCA?", What Micro, p. 40-1 (ISSN: 0264-441X) (Jun. 1989).

IBM Datasheet, "Sun External I/O Expansion Unit", Sun Microsystems, Inc. (Apr. 2007).

IBM United States Hardware Announcement, "IBM Power Systems" Significant I/O Enhancements, pp. 109-305 (Apr. 28, 2009).

Anerdi et al., "Enclosure With Concurrently Maintainable Field Replaceable Units", U.S. Appl. No. 12/725,620, filed Mar. 17, 2010.

Atkins et al., "Load Shedding During Emergency Power OFF Event", U.S. Appl. No. 12/725,844, filed Mar. 17, 2010.

* cited by examiner

INPUT/OUTPUT AND DISK EXPANSION SUBSYSTEM FOR AN ELECTRONICS RACK

BACKGROUND

The present invention relates in general to enhancing input/output and storage capability of the electronic subsystems within an electronics rack(s) of a data center, including rack-mounted assemblages of individual electronics units, such as rack-mounted computer server units.

An electronics rack, such as a high-end computer rack, may employ multiple computer server units within the rack. Each computer server unit is an example of an electronic subsystem and may include one or more processors, memory, input/output (I/O) adapters and one or more computer storage devices. Depending upon the implementation, additional input/output capacity or storage capacity may be desired than can be provided within the individual computer server unit(s) of the rack. For example, to allow ever-high throughput and heavy virtualization that high-end computer systems are capable of implementing, additional I/O adapter slots and additional device storage slots than can currently be accommodated within a computer server unit of the electronics rack are desired. In addition, virtualized servers typically require dedicated, local, non-volatile disk storage for each logical partition.

BRIEF SUMMARY

In one aspect, the shortcomings of the prior art are overcome and additional advantages are provided through the provision of an input/output (I/O) and disk expansion subsystem for an electronics rack. The I/O and disk expansion subsystem includes an I/O and disk expansion subsystem enclosure and a plurality of field-replaceable units. The I/O and disk expansion subsystem enclosure, which is configured for an the electronics rack that includes at least one electronic subsystem that is to couple to the I/O and disk expansion subsystem, includes a first side and a second side in opposing relation, with the first side being accessible through a front of the electronics rack when the I/O disk expansion subsystem enclosure is positioned therein, and the second side being accessible through a back of the electronics rack when the I/O and disk expansion subsystem enclosure is positioned therein. The plurality of field-replaceable units are configured to reside within the I/O and disk expansion subsystem enclosure, and be accessible and removable through at least one of the first side or the second side of the I/O and disk expansion subsystem enclosure without removing the I/O and disk expansion subsystem enclosure from the electronics rack. The plurality of field-replaceable units include at least one input/output adapter cage, at least one storage device cage, at least one power and control supply, and a midplane connector assembly. The at least one input/output adapter cage includes a plurality of input/output adapter receiving slots for facilitating coupling of one or more input/output adapters to the at least one electronic subsystem of the electronics rack. The at least one storage device cage includes a plurality of storage device receiving slots for facilitating coupling of one or more storage devices to the at least one electronic subsystem of the electronics rack. The at least one power and control supply is provided for powering and controlling the I/O and disk expansion subsystem, and includes at least one fan assembly for moving air within the I/O and disk expansion subsystem enclosure to facilitate cooling thereof. The at least one input/output adapter cage, the at least one storage device cage, and the at least one power and control supply dock to and are electrically interconnected by the midplane connector assembly within the I/O and disk expansion subsystem enclosure.

In another aspect, an electronics rack is provided which includes at least one electronic subsystem, and an input/output (I/O) and disk expansion subsystem coupled to the at least one electronic subsystem. The I/O and disk expansion subsystem includes an I/O and disk expansion subsystem enclosure, and a plurality of field-replaceable units. The I/O and disk expansion subsystem enclosure includes a first side and a second side in opposing relation, with the first side being accessible through a front of the electronics rack and the second side being accessible through a back of the electronics rack. The plurality of field-replaceable units are configured to reside within the I/O and disk expansion subsystem enclosure and be accessible and removable through at least one of the first side or the second side of the I/O and disk expansion subsystem enclosure without removing the I/O and disk expansion subsystem enclosure from the electronics rack. The plurality of field-replaceable units include at least one input/output adapter cage, at least one storage device cage, at least one power and control supply, and a midplane connector assembly. The at least one input/output adapter cage includes a plurality of input/output adapter receiving slots for facilitating coupling of one or more input/output adapters to the at least one electronic subsystem of the electronics rack. The at least one storage device cage includes a plurality of storage device receiving slots for facilitating coupling of one or more storage devices to the at least one electronic subsystem of the electronics rack. The at least one power and control supply is provided for powering and controlling the I/O and disk expansion subsystem, and includes at least one fan assembly for moving air within the I/O and disk expansion subsystem enclosure to facilitate cooling thereof. The at least one input/output adapter cage, the at least one storage device cage, and the at least one power and control supply dock to and are electrically interconnected by the midplane connector assembly within the I/O and disk expansion subsystem enclosure.

In a further aspect, a method of manufacturing multiple input/output (I/O) and disk expansion subsystems for different-sized electronics racks is provided. The method includes: providing a first I/O and disk expansion subsystem enclosure configured for a first electronics rack of the multiple different-sized electronics racks, the first electronics rack comprising at least one electronic subsystem requiring expanded input/output or device storage, the first I/O and disk expansion subsystem enclosure including a first side and a second side in opposing relation, the first side being accessible through a front of the first electronics rack when the first I/O and disk expansion subsystem enclosure is positioned therein and the second side being accessible through a back of the first electronics rack when the first I/O and disk expansion subsystem enclosure is positioned therein; providing a second I/O and disk expansion subsystem enclosure configured for a second electronics rack comprising at least one electronic subsystem requiring expanded input/output or device storage, the second I/O and disk expansion subsystem enclosure comprising a first side and a second side in opposing relation, the first side being accessible through a front of the second electronics rack when the second I/O and disk expansion subsystem enclosure is positioned therein and the second side being accessible through a back of the second electronics rack when the second I/O and disk expansion subsystem enclosure is positioned therein; providing a plurality of field-replaceable units configured to reside within both the first I/O and disk expansion subsystem enclosure and the second I/O and disk expansion subsystem enclosure, the plurality of field-replaceable units being accessible and removable through at least one of the first side or the second side of the respective first or second I/O and disk expansion subsystem enclosure when positioned therein without removing the respective first or second I/O and disk expansion subsystem enclosure from the associated first or second electronics rack, the plurality of field-replaceable units comprising: at least one input/output adapter cage, the at least one input/output adapter cage comprising a plurality of input/output adapter receiving slots for facilitating coupling of one or more input/output adapters to the at least one electronic subsystem of the associated first or the second electronics rack; a fan assembly configured to reside within at least one power and control supply powering and electrically interconnecting components of the respective first or second I/O and disk expansion subsystem, the fan assembly moving air within the respective first or second I/O and disk expansion subsystem enclosure when operatively inserted therein to facilitate cooling thereof; and a conduit card facilitating distribution of power and control signals between a midplane connector card and at least one storage device cage of the respective first or second I/O and disk expansion subsystem enclosure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack", "rack-mounted electronic equipment", "rack unit" and "rack" are used interchangeably, and unless otherwise specified include any housing, frame, rack, compartment, blade server system, etc., having one or more components of a computer system or electronics system, and may be, for example, a stand alone computer server unit having high, mid or low end processing capability. In one embodiment, an electronics rack may comprise at least one electronic subsystem, one or more of which requires additional input/output or storage capability. "Electronic subsystem" refers to any sub-housing, blade, book, drawer, node, compartment, etc., having one or more electronic components disposed therein. Each electronic subsystem of an electronics rack may be movable or fixed relative to the electronics rack, with rack-mounted electronic drawers of a multi-drawer rack unit and blades of a blade center system being two examples of subsystems of an electronics rack. As one example, one or more electronic subsystems within the electronics rack are server units requiring additional input/output and/or computer storage capability. As one specific example, the electronics rack may be an IT Enterprise Computer System, implemented, for example, employing System z® server units, or System p® server units, offered by International Business Machines Corporation. System z® and System p® are registered trademarks of International Business Machines Corporation, of Armonk, N.Y.

Reference is made below to the drawings, which are not drawn to scale for ease of understanding, wherein the same reference numbers used throughout different figures designate the same or similar components.

Figure 1:
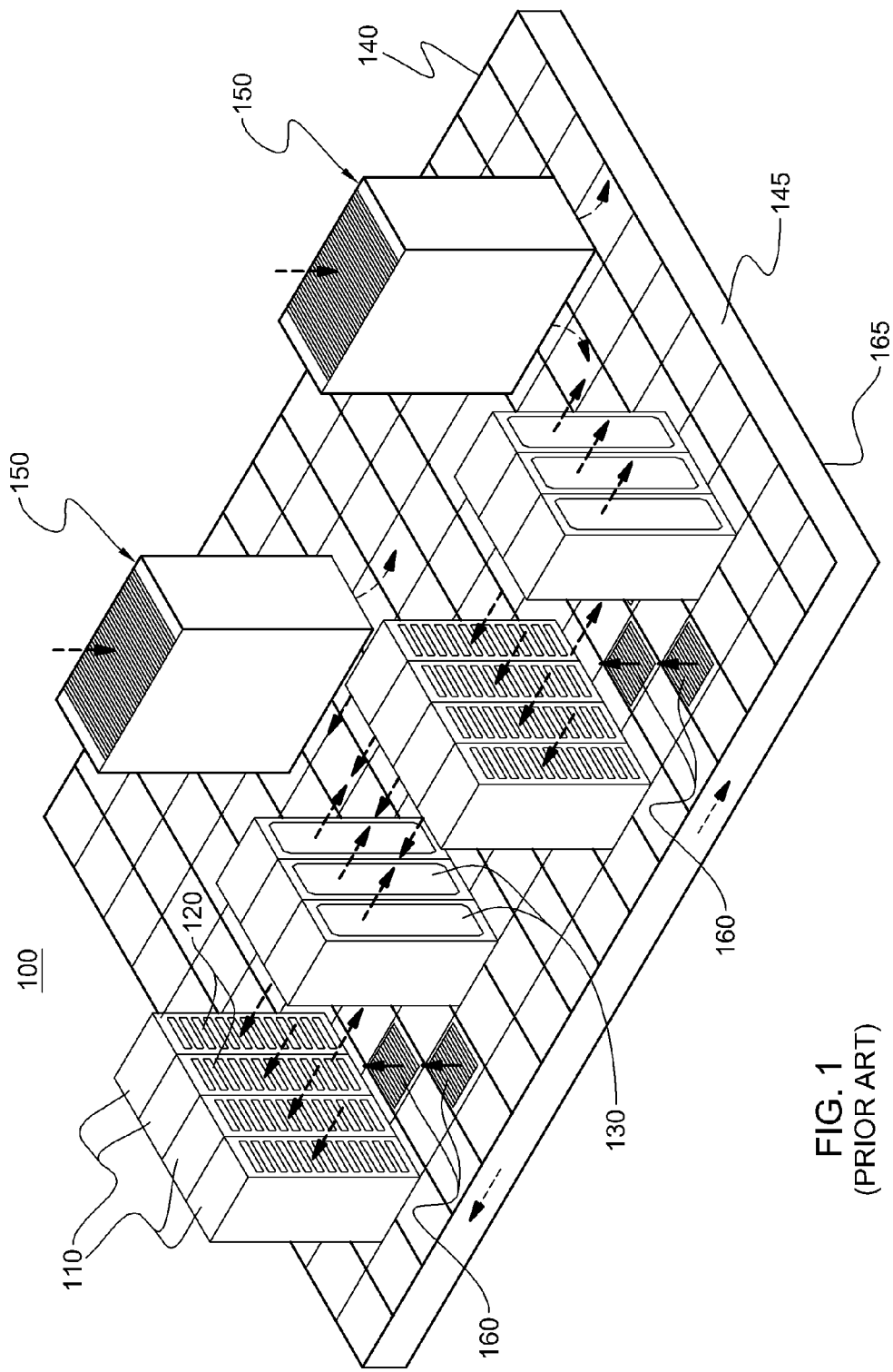
FIG. 1 depicts one embodiment of a conventional raised floor layout of an air-cooled computer installation comprising multiple electronics racks.

FIG. 1 depicts a raised floor layout of a data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at the front (i.e., air inlet sides 120) of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
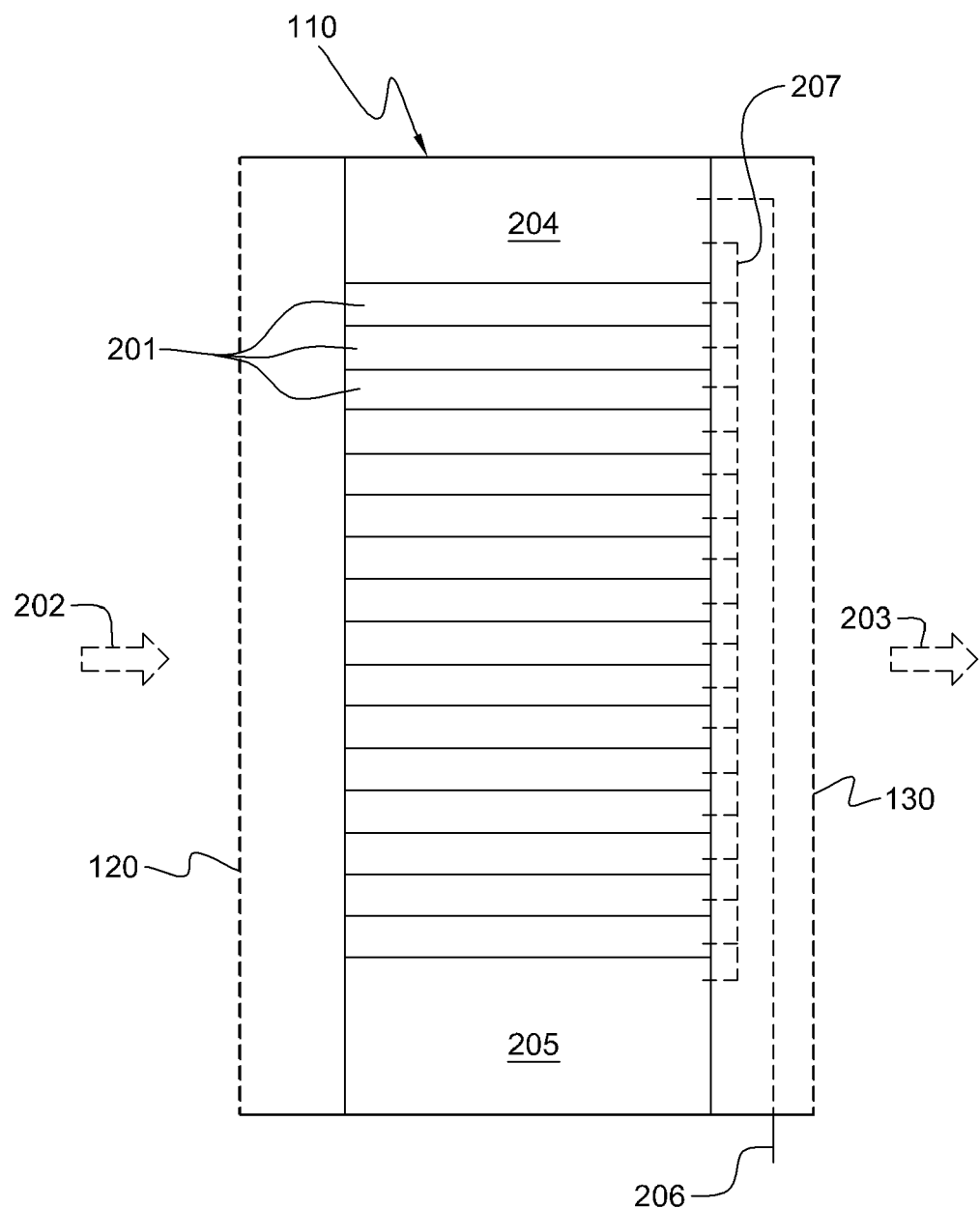
FIG. 2 is a cross-sectional elevational view of one embodiment of an electronics rack comprising an I/O and disk expansion subsystem, in accordance with an aspect of the present invention.

FIG. 2 is an elevational representation of one embodiment of a 24-inch electronics rack 110 incorporating an input/output (I/O) and disk expansion subsystem, in accordance with an aspect of the present invention. Electronics rack 110 includes a plurality of electronics subsystems 201, which (in the embodiment illustrated) are air-cooled by cool air 202 ingressing via louvered air inlet door 210, and exhausting out louvered air outlet door 211 as hot air 203. Electronics rack 110 also includes at least one bulk power assembly 204. One or more electronic subsystems 201 include, in one example, one or more processors, associated memory, input/output adapters and disk storage devices. Also illustrated in FIG. 2 is an I/O and disk expansion subsystem 205, which includes, in one detailed example, PCIe card slots and disk drivers for one or more electronic subsystems of the electronics rack. Note that I/O and disk expansion subsystem 205 could be disposed anywhere within electronics rack 110, with the positioning shown in FIG. 2 being provided as one example only. For example, the I/O and disk expansion subsystem 205 could alternatively be disposed in the middle of the electronics rack, if desired.

In this rack example, a three-phase AC source feeds power via an AC power cord 206 to bulk power assembly 204, which transforms the supplied AC power to an appropriate DC power level for output via distribution cables 207 to the plurality of electronics subsystems 201. AC power cord 206 supplies, in one example, three phases for international 415 $V_{RMS}$, and has a current limit rating, for example, of 100 amps. The number of electronic subsystems installed in the electronics rack is variable and depends on customer requirements for a particular system.

As noted briefly above, depending upon the implementation, additional input/output capacity and/or storage device capacity may be desired than can be provided within the individual electronic subsystems (e.g., individual computer server units) of the electronics rack. For example, to allow for the greater throughput and virtualization that high-end computer systems are capable of implementing today, additional I/O adapter slots and additional device storage slots than can currently be accommodated within the computer server units of the rack are desired. In addition, virtualized servers typically require dedicated local non-volatile disk storage for each logical partition, and the disk space for this non-volatile storage is often not adequate within existing server units.

The present invention addresses these needs by providing an input/output (I/O) and disk expansion subsystem employing building blocks for different enclosure sizes which comprise very high density and high modularity field-replaceable units, as well as an electrical design for the expansion subsystem that supports extreme high availability. The modularity of the I/O and disk expansion subsystems allows design and building block reuse within, for example, an enclosure built for a 19-inch electronics rack and an enclosure built for a 24-inch electronics rack. In fact, other rack dimensions could be readily accommodated using the field-replaceable components described herein. As used herein, the input/output (I/O) and disk expansion subsystem is alternatively referred to as an "I/O and disk expansion subsystem", or simply the "expansion subsystem", while the input/output (I/O) and disk expansion subsystem enclosure is alternatively referred to as the "I/O and disk expansion subsystem enclosure", or simply the "expansion subsystem enclosure". Further, the use of "disk" in "input/output and disk expansion subsystem" throughout the present application refers generally to any storage unit, and not to a particular type of storage unit, such as a disk drive.

Figure 3A:
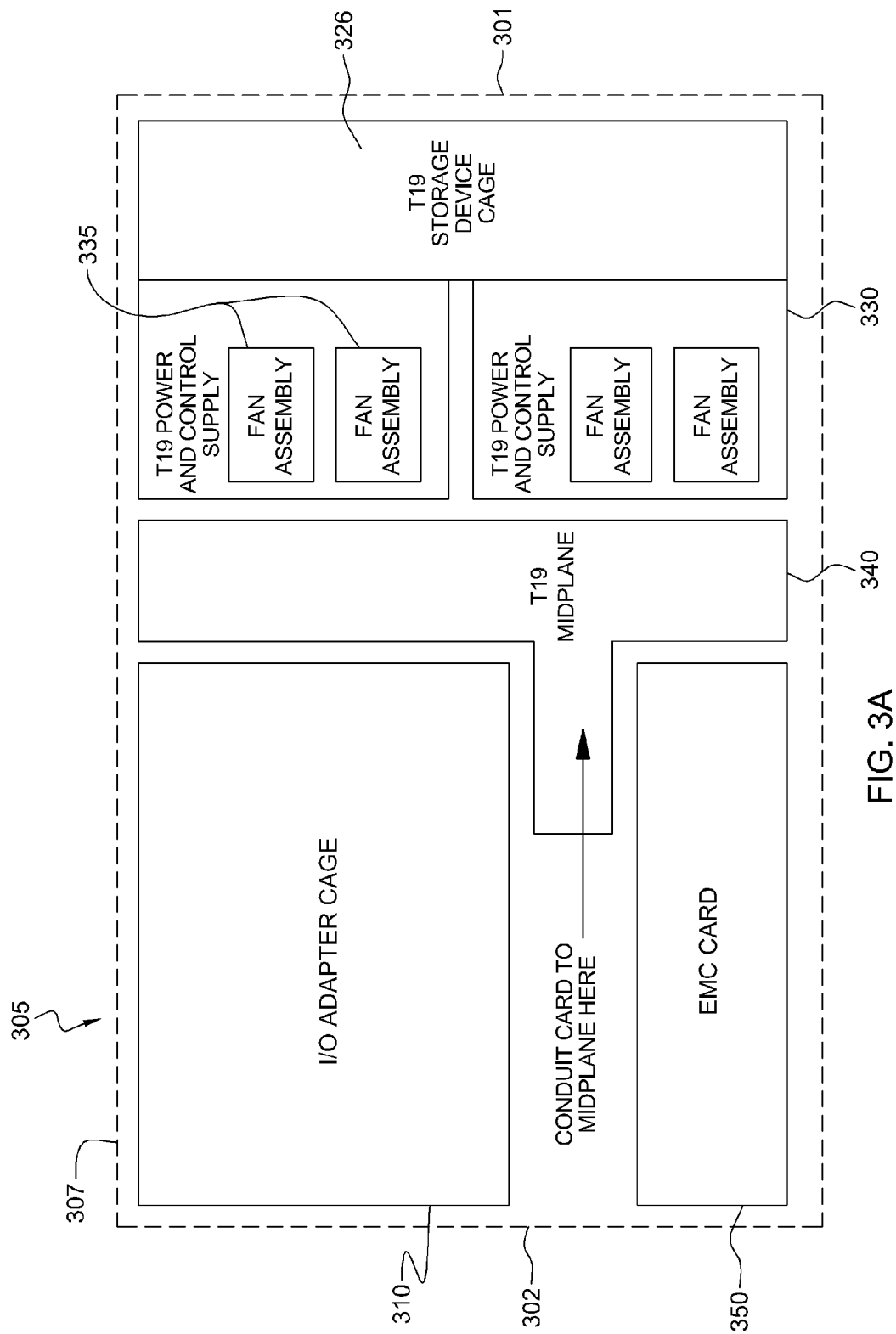
FIG. 3A is a simplified plan view of one embodiment of an I/O and disk expansion subsystem for an electronics rack, in accordance with an aspect of the present invention.
Figure 3B:
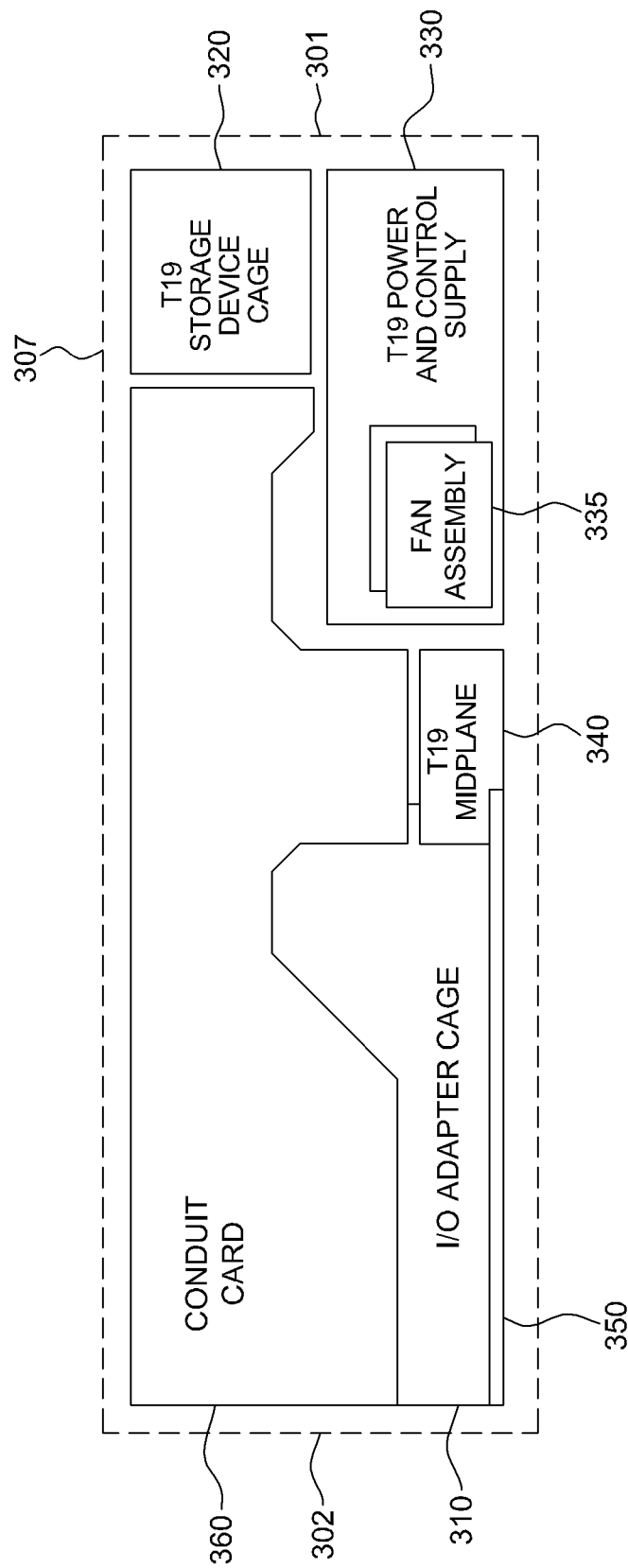
FIG. 3B is an elevational view of the I/O and disk expansion subsystem of FIG. 3A, in accordance with an aspect of the present invention.

FIGS. 3A & 3B depict one embodiment of an I/O and disk expansion subsystem 305, in accordance with an aspect of the present invention, for a 19-inch wide electronics rack. Various components described hereinbelow are identical between I/O and disk expansion subsystem 305 for a 19-inch electronics rack and an I/O and disk expansion subsystem 505, illustrated in FIGS. 5A & 5B, for a 24-inch electronics rack. As used herein, "T19" refers to a component of an expansion subsystem for a 19-inch rack, and "T24" refers to a component of an expansion subsystem for a 24-inch rack.

The I/O and disk expansion subsystem enclosure 307 shown in FIGS. 3A & 3B accommodates an input/output adapter cage 310, a T19 storage device cage 320, two T19 power and control supplies 330, each of which includes two fan assemblies 335, a T19 midplane connector card 340 of a midplane connector assembly comprising the T19 midplane connector card 340 and a conduit card 360, and an enclosure management controller (EMC) card 350. The input/output adapter cage 310 is a common building block between multiple I/O and disk expansion subsystems and may be, in one example, a PCIe cage offering 10 PCIe slots (or bays) for 10 blind swap cassettes holding 10 PCIe adapters, with the blind swap cassettes also being a common building block. Additionally, fan assemblies 335 may be a common building block employed both in 19-inch and 24-inch I/O and disk expansion subsystem embodiments. These components are described further below.

As a specific example, T19 storage device cage 320 is a direct access storage device (DASD) cage comprising a printed circuit board housed in a mechanical cage that offers, for example, 18 SAS SFF disk drive bays, and four slots for port expander cards. The DASD cage connects the port expander cards electrically with SAS wires to the disk drives within the cage, and also connects the port expander cards to SAS wires coming from conduit card 360. Note that in one embodiment, conduit card 360 and the port expander cards are also common field-replaceable units between the 19-inch and 24-inch I/O and disk expansion subsystems disclosed herein. In one implementation, the conduit card offers four SAS four-lane connectors, which allow a PCIe to SAS adapter card plugged into the PCIe cage to be cabled to the conduit card. The conduit card has SAS wires between the connectors and the DASD cage that eventually pass SAS traffic to the port expander cards, and from there to the disk drives. The conduit card 360 plugs to the midplane connector card 340, as well as to the DASD cage (in the 19-inch or 24-inch version) and provides DC power and control signals from T19 midplane connector card 340 to the DASD cage (i.e., T19 storage device cage 320). Conduit card 360 also includes a three-position switch that allows a manual setting of the drive grouping. This is read by the power and control supply and communicated to the port expander cards to follow the correct mode. The three modes group the drives into a single group, two groups, or four groups. The port expander card has, in one embodiment, an SAS expander chip which directs SAS traffic from the conduit card to the drives. It also includes soft switches that control power to the disk drives, and thus, allow hot plugging of the disk drives. As used herein "hot plugging" or "hot swapping" refers to an ability to remove and replace the particular component from the next higher level packaging while the next higher level system remains operational. The port expander cards also connect together (in one embodiment) via SAS wires in the DASD cage to support a single group configuration.

Notwithstanding describing of storage device cage 320 as a DASD cage, in one example, the storage device cage can generally be configured to accommodate various types of storage units, such as hard drives, tape drives, or other devices for storing computer data.

T19 power and control supplies 330 convert AC power into DC voltage levels required by the I/O and disk expansion subsystem 305. In addition, these power and control supplies include a microprocessor that communicates to and controls the building blocks within the expansion subsystem enclosure 307. For example, the power and control supplies turn ON soft switches to components within the building blocks, initialize chips and release them from reset, control the fan speed, and EC information, and other control functions. The T19 power and control supplies 330 illustrated in each supply house two fan assemblies 335. There are two T19 power and control supplies for redundancy, and each supply can by itself power and control the entire I/O and disk expansion subsystem 305. For 19-inch racks, the input power is between 90 volts AC and 259 volts AC. The T19 power and control supply accepts this input power and generates the necessary DC voltage levels for the expansion subsystem enclosure. In one example of a 19-inch expansion subsystem, this includes 12V and 5V to SAS SFF disk drives, as well as 12V and 3.3V to PCIe input/output adapter slots. Also, several other voltages, including 1.2V, 1.5V and 1.8V may be required for the bridge chips and expander chips, noted in the I/O adapter cage and port expander building block descriptions below. For 19-inch rack expansion subsystems, AC utility power is brought to power strips in the back of the electronics rack, and from there, run via AC line cords to the front of the enclosure. This supports a configuration where two separate utility lines can be brought to the electronics rack, and thus each power and control supply can be run from a separate utility for redundancy.

T19 midplane connector card 340 is centrally disposed within I/O and disk expansion subsystem enclosure 307, and both T19 power and control supplies 330 dock into the midplane connector card. The midplane connector card functions include distributing the DC power and enclosure control signals from the power and control supplies to the input/output adapter cage 310, the T19 storage device cage 320, and other circuitry within the I/O and disk expansion subsystem enclosure. Conduit card 360, enclosure management controller card 350, and the input/output adapter cage 310 plug into T19 midplane connector card 340. EMC card 350 includes, in one embodiment, a nine-pin D-shell connection which allows for a data center control interface connection. In one embodiment, the microprocessor, memory addressing circuitry, and connectors employed by this card may be common to other IBM product cards, though the EMC card has a different form factor. By way of example, reference POWER™ Series product 7311, offered by International Business Machines Corporation, which has the same circuitry and nine-pin D-shell connectors as implemented (in one embodiment) by EMC card. Another embodiment could allow an Ethernet or other standard protocol connection for control of the I/O and disk expansion subsystem. The EMC card 350 circuitry could be modified by one skilled in the art to handle the protocol translation.

Fan assembly 335 is, in one example, a common building block between the 19-inch and 24-inch I/O and disk expansion subsystems described herein. In one embodiment, fan assembly 335 includes two fans arranged to counter-rotate, with independent control circuitry for redundancy. The fan assemblies are housed within respective power and control supplies and facilitate air flow through the power and control supplies and within the I/O and disk expansion subsystem enclosure 307, for example, from a first side 301 to a second side 302 of the enclosure, wherein the first side is disposed at the front of the electronics rack, and the second side is disposed at the back of the electronics rack when the I/O and disk expansion subsystem is operatively positioned within the electronics rack. In the embodiment of FIGS. 3A & 3B, there are two fan assemblies 335 for each T19 power and control supply 330, for a total of four fan assemblies and eight total fans. (In the embodiment illustrated in FIGS. 5A & 5B, there are three fan assemblies per T24 power and control supply embodiment described below.) DC power for the fans is common, and thus if either T19 power and control supply is functional, it would power the fan assemblies in the other power and control supply as well, such that air cooling is not impacted should one of the T19 power and control supplies 330 fail. There are separate control signals to the fan assemblies from both T19 power and control supplies so that either power and control supply 330 could control the speed of the fans in all the fan assemblies 335, that is, should the other power and control supply fail.

Note that in the implementation of FIGS. 3A & 3B, T19 storage device cage 320 and T19 power and control supplies 330 are accessible and replaceable through front side 301 of the I/O and disk expansion subsystem enclosure 307, and input/output adapter cage 310, T19 midplane connector card 340, EMC card 350 and conduit card 360 are accessible and replaceable from the back side 302 of the I/O and disk expansion subsystem enclosure 307. Thus, all building blocks illustrated are advantageously field-replaceable units, which are accessible through either the front or the back of the subsystem enclosure. In one implementation, these units are accessible without the use of tools, and in many cases, can be "hot swapped", that is, can be replaced while the I/O and disk expansion subsystem is operational. The hot swappable field-replaceable units include T19 power and control supplies 330, fan assemblies 335 and EMC card 350. Additional hot swappable components described further below include blind swap cassettes accommodating the input/output adapters, drive carriers accommodating the disk drives, and port expanders cards coupled to the disk drives.

Field-replaceable units requiring the expansion subsystem to be powered OFF for replacement include T19 midplane connector card 340, conduit card 360, T19 storage device cage 320 and the input/output adapter cage 310 (in the case of the 19-inch I/O and disk expansion subsystem 305 since there is only one input/output adapter cage 310 in this subsystem). Note that significant to this implementation is that both T19 midplane connector card 340 and conduit card 360 are field-replaceable units, which are accessible, in one embodiment, through back side 302; for example, by first removing input/output adapter cage 310 and EMC card 350.

FIGS. 4A-4F depict one detailed embodiment of an I/O and disk expansion subsystem 305 for a 19-inch electronics rack comprising the above-described building blocks, in accordance with an aspect of the present invention.

Figure 4A:
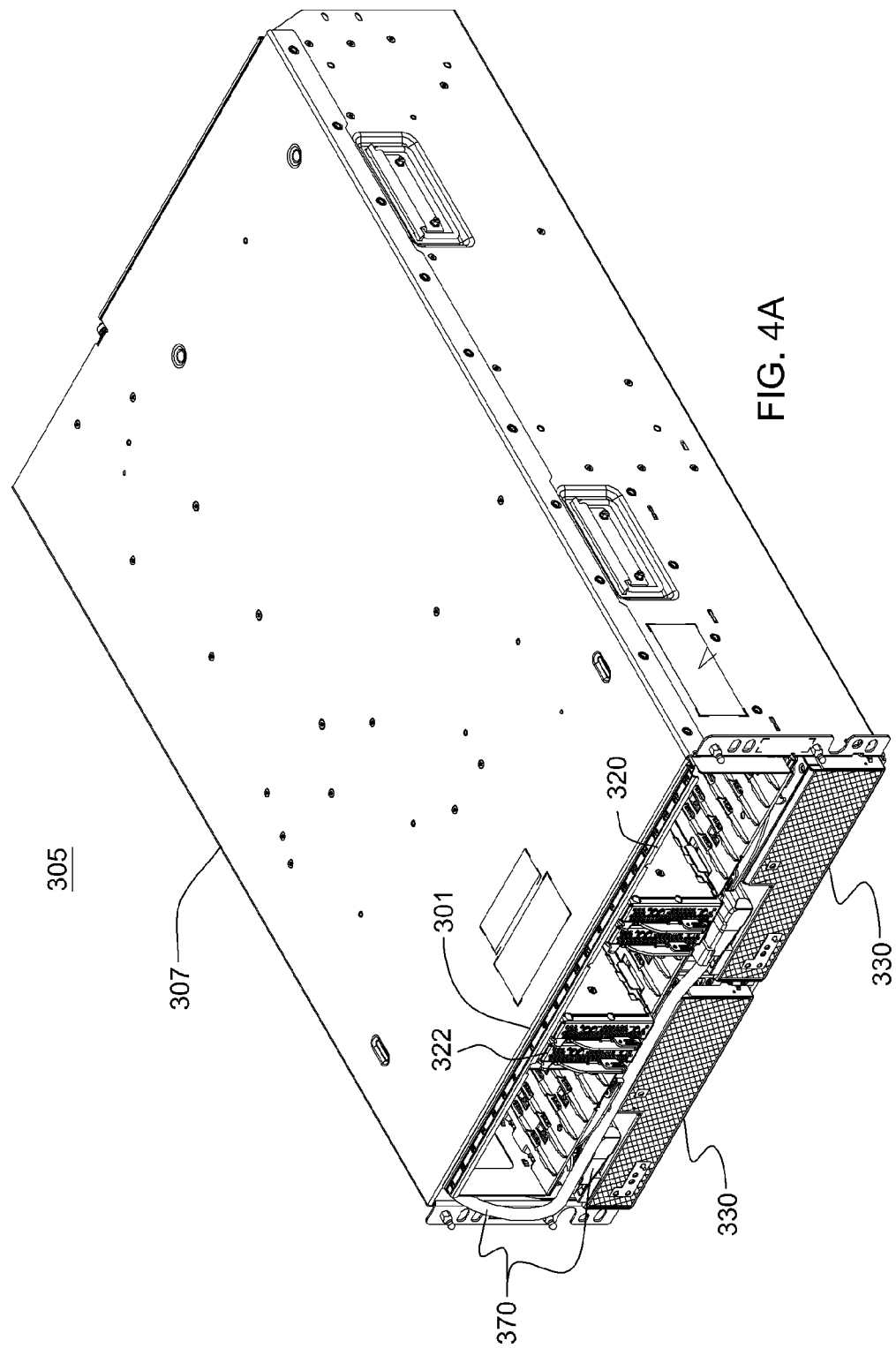
FIG. 4A is a detailed front isometric view of a partially assembled I/O and disk expansion subsystem such as depicted in FIGS. 3A & 3B, in accordance with an aspect of the present invention.

Referring first to FIG. 4A, one embodiment of an I/O and disk expansion subsystem enclosure 307 (or chassis) is illustrated from front side 301 of the enclosure. Expansion subsystem enclosure 307 accepts and houses the above-described building blocks, or modular components, of the I/O and disk expansion subsystem 305. As illustrated, two power and control supplies 330 and storage device cage 320 are accessible through front side 301 of I/O and disk expansion subsystem enclosure 307, with storage device cage 320 being disposed above power and control supplies 330 (by way of example). Power and control supplies 330 accept (in one embodiment) separate AC line cords 370, which provide input power to power and control supplies 330 from, for example, 100 volt-240 volt AC supplies at the back of the 19-inch electronics rack (not shown). The power and control supplies 330 converts this voltage to DC voltages used by the expansion subsystem 305 and include management firmware that controls the power ON, initialization, and maintenance features of the expansion subsystem. The power and control supplies 330 are redundant, modular units that can be replaced in the field while the I/O and disk expansion subsystem remains operational. That is, the right side power and control supply is fully redundant to the left side power and control supply, and both power and control supplies are individually hot swappable. If either power and control supply fails, the other will continue to maintain the subsystem voltage levels operational, and the failed power and control supply can be replaced while the I/O and disk expansion subsystem continues to function. The two AC line cords 370 extend from an AC power line conduit (see FIG. 4C) disposed within this expansion subsystem enclosure 307 to bring line power from the back of the electronics rack to the front of the electronics rack for connecting to power and control supplies 330.

Four port expander cards 322 are illustrated within storage device cage 320. These port expander cards have expander circuits (or chips) which control power and SAS traffic to the disk drives. In this T19 embodiment, the two leftmost port expander cards are redundant and control the 9 leftmost disk drive slots (or bays), while the two rightmost cards are also redundant and control the 9 rightmost disk drive slots (or bays). The port expander card is a modular unit that can be replaced in the field. The storage device cage 320 provides the drive slot locations as well as the port expander slots, and interconnects them. Storage device cage 320 connects the port expander cards electrically to the conduit card disposed within the I/O and disk expansion subsystem enclosure, which has SAS ports at the back of the enclosure. The storage device cage 320 is also a modular unit and is field-replaceable.

Figure 4B:
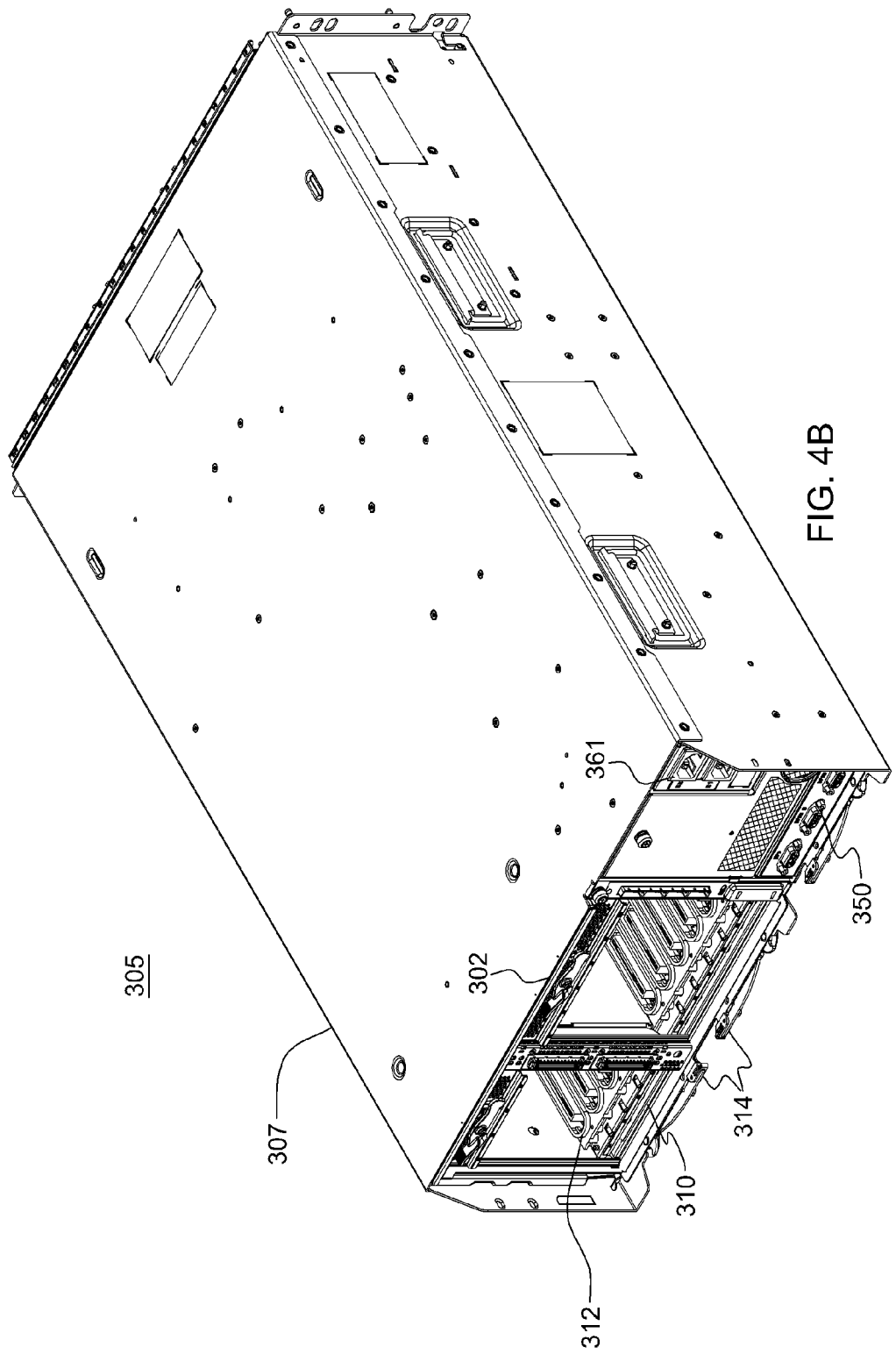
FIG. 4B is a back isometric view of the I/O and disk expansion subsystem of FIG. 4A, in accordance with an aspect of the present invention.

FIG. 4B illustrates I/O and disk expansion subsystem 305 from back side 302. As shown, input/output adapter cage 310 is accessible from back side 302 of I/O and disk expansion subsystem enclosure 307. The input/output adapter cage is a modular unit and is field-replaceable. As one detailed example, the input/output adapter cage is a PCIe cage which offers 10 PCIe 8× full-height, full-length slots 312. The PCIe slots each accept a blind swap cassette (not shown). The blind swap cassettes are mechanical wrappers to respective PCIe 8× cards that allow blind plugging of the PCIe cards into the cage. As explained further below, in one embodiment, a blind swap cassette holds one PCIe adapter and is inserted into a corresponding PCIe slot, with a tab on the front of the blind swap cassette being pressed down to plug the adapter into the connector on the PCIe cage. The enclosure management controller card 350 is also visible from this figure. By way of example, the POWER™ Series product 7311 offered by International Business Machines Corporation of Armonk, N.Y., uses a similar control card.

Latches 314 are provided for input/output adapter cage 310, which allow for tool-less extraction and insertion of this modular component. Note that all modular components described herein have latches, or thumbscrews, or a combination (in the case of the power and control supplies), so that they can be inserted and extracted without the use of tools. Receptacles 361, which are part of the AC line cord conduit (see FIG. 4C), facilitate bringing two separate AC line cords from back side 302 to the front side of the I/O and disk expansion subsystem enclosure 307.

Figure 4C:
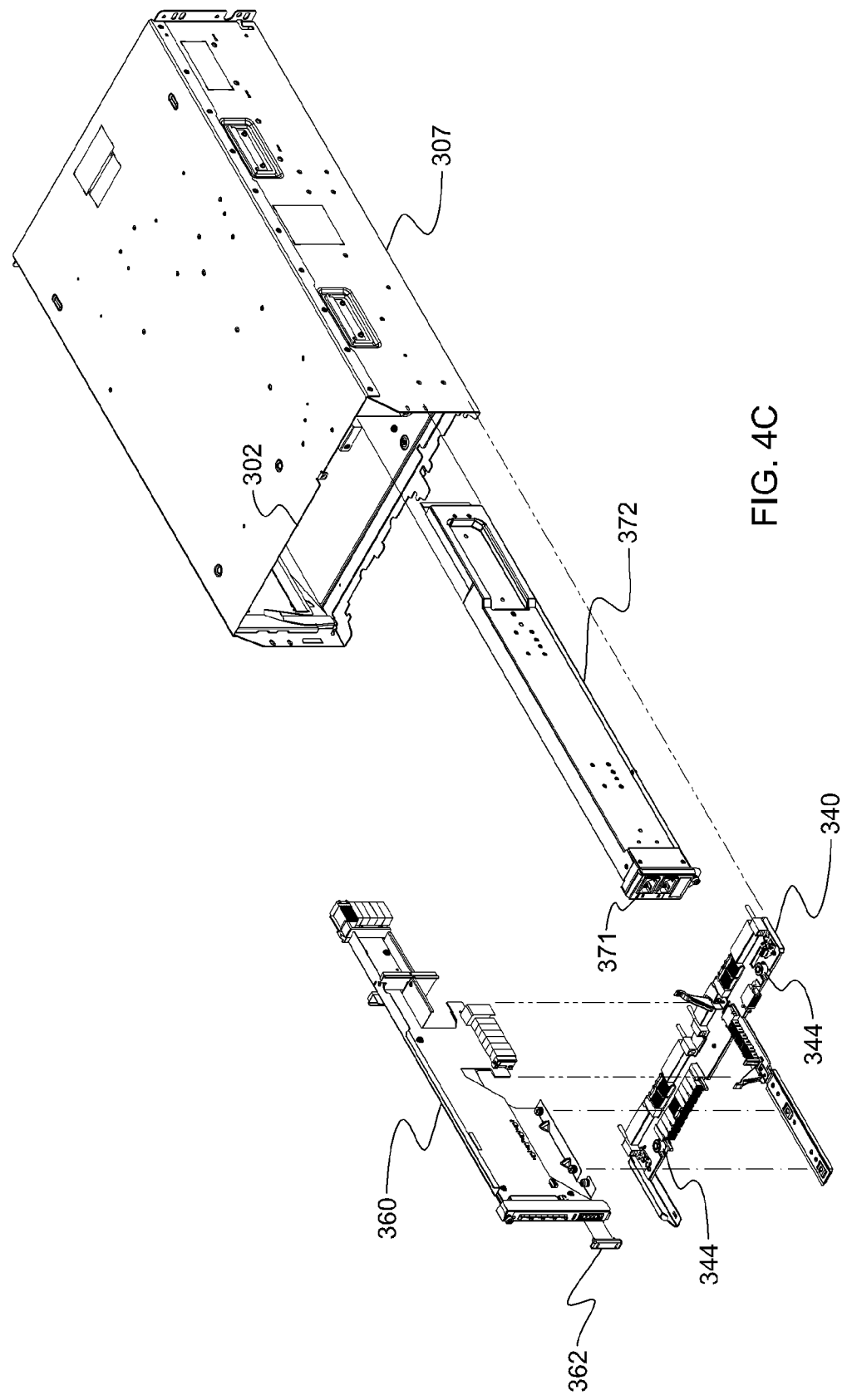
FIG. 4C is an exploded back isometric view of a partially assembled I/O and disk expansion subsystem of FIGS. 4A & 4B, showing a midplane connector assembly and an AC line cord conduit thereof, in accordance with an aspect of the present invention.

FIG. 4C illustrates one embodiment of midplane connector card 340, conduit card 360 and AC line cord conduit 372 exploded from the back of I/O and disk expansion subsystem enclosure 307. AC line cord conduit 372 accommodates the AC line cords 370 (see FIG. 4A) and facilitates transferring power from back side 302 to the front side of I/O and disk expansion subsystem enclosure 307. The AC line cord conduit 372 is another building block which is field-replaceable.

Conduit card 360 and midplane connector card 340 together form a midplane connector assembly. The conduit card 360 has thumbscrews that hold it to midplane connector card 340, and the conduit card and midplane connector card slide together into the I/O and disk expansion subsystem enclosure 307, as illustrated in FIG. 4C. These are the first modular components to be inserted into the enclosure during assembly. The input/output adapter cage, the EMC card, the power and control supplies and the storage device cage dock (or plug into) the midplane connector assembly. To access the midplane connector assembly, the input/output adapter card and the EMC card are first removed from the enclosure. Midplane connector card 340 has latches that assist with removal of the conduit card if either the conduit card or the midplane connector card need to be replaced in the field. Cover 362 is optionally employed to cover a conduit card connection which is unused in the 19-inch version of the I/O and disk expansion subsystem. As noted, conduit card 360 is another building block that is common to the 24-inch version of the I/O and disk expansion subsystem (described below with reference to FIGS. 5A-6G). In the embodiment illustrated, quarter-turn plungers 344 may be employed to secure the midplane connector assembly to the enclosure. Once conduit card 360 and midplane connector card 340 are assembled and slid into the expansion subsystem enclosure 307 together, the quarter-turn plungers 344 may be turned to allow them to drop into respective openings in the enclosure. The two plungers thus locate and lock the midplane connector card, and therefore, the conduit card. There is also a thumbscrew at the front of the conduit card that secures the conduit card to the top of the expansion subsystem enclosure (in one embodiment).

Figure 4D:
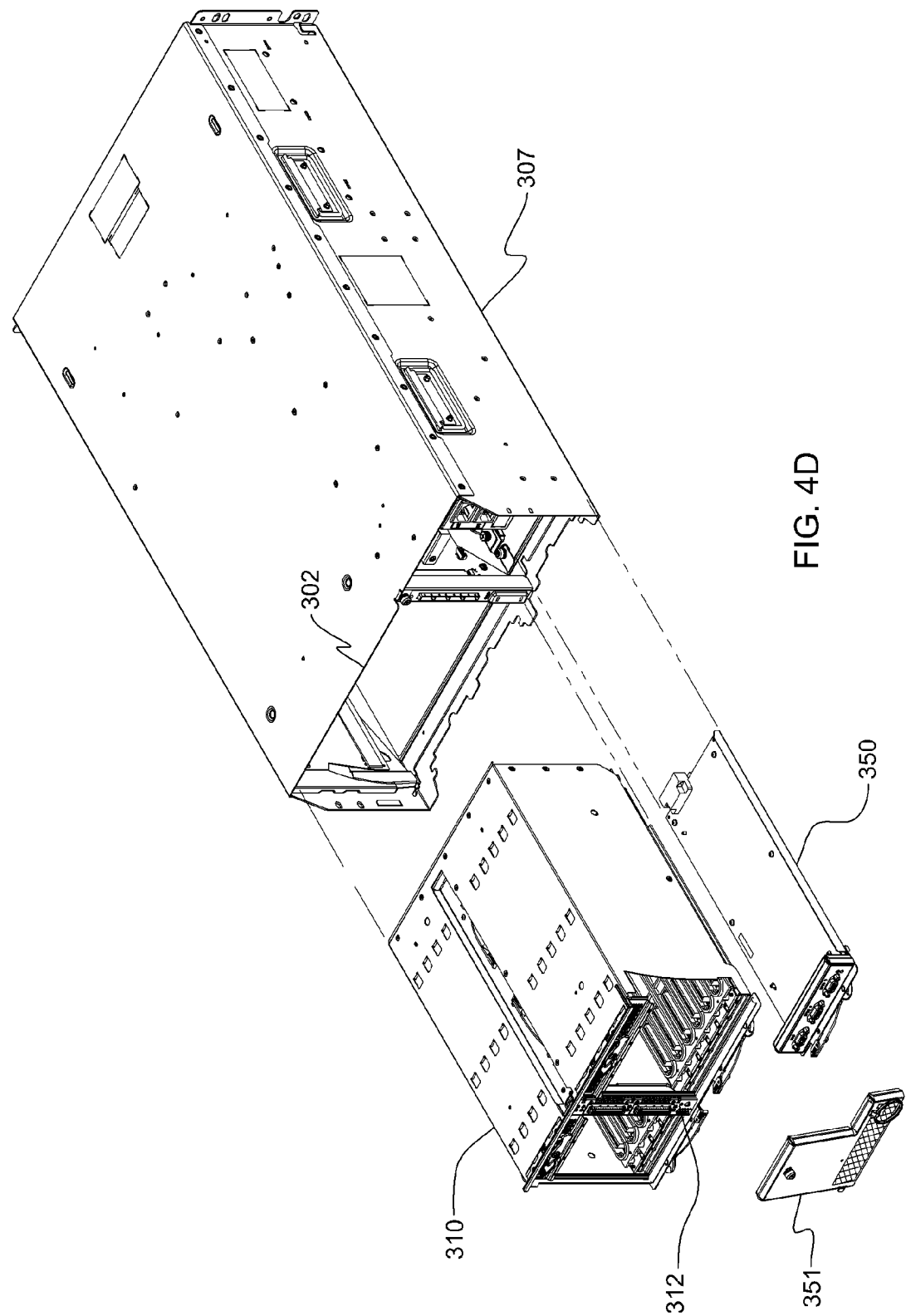
FIG. 4D is a back isometric view of the partially assembled structure of FIG. 4C, after placement of the midplane connector assembly and AC line cord conduit within the I/O and disk expansion subsystem enclosure, and illustrating one embodiment of an input/output adapter cage accessible through the back side of the I/O and disk expansion subsystem enclosure, in accordance with an aspect of the present invention.

FIG. 4D illustrates back side 302 of the I/O and disk expansion subsystem enclosure 307 with the midplane connector assembly operatively positioned therein. One embodiment of input/output adapter cage 310 is illustrated. In one example, this cage is a PCIe cage that includes a planar card and a daughter card. The daughter card supplies InfiniBand cable ports 312 that allow for connection to the one or more electronic subsystems of the rack, such as one or more server units requiring additional I/O and/or disk storage capacity. The enclosure management controller (EMC) card 350 is also shown in this figure, along with a cover 351 which attaches over EMC card 350 when operatively positioned within I/O and disk expansion subsystem enclosure 307.

Figure 4E:
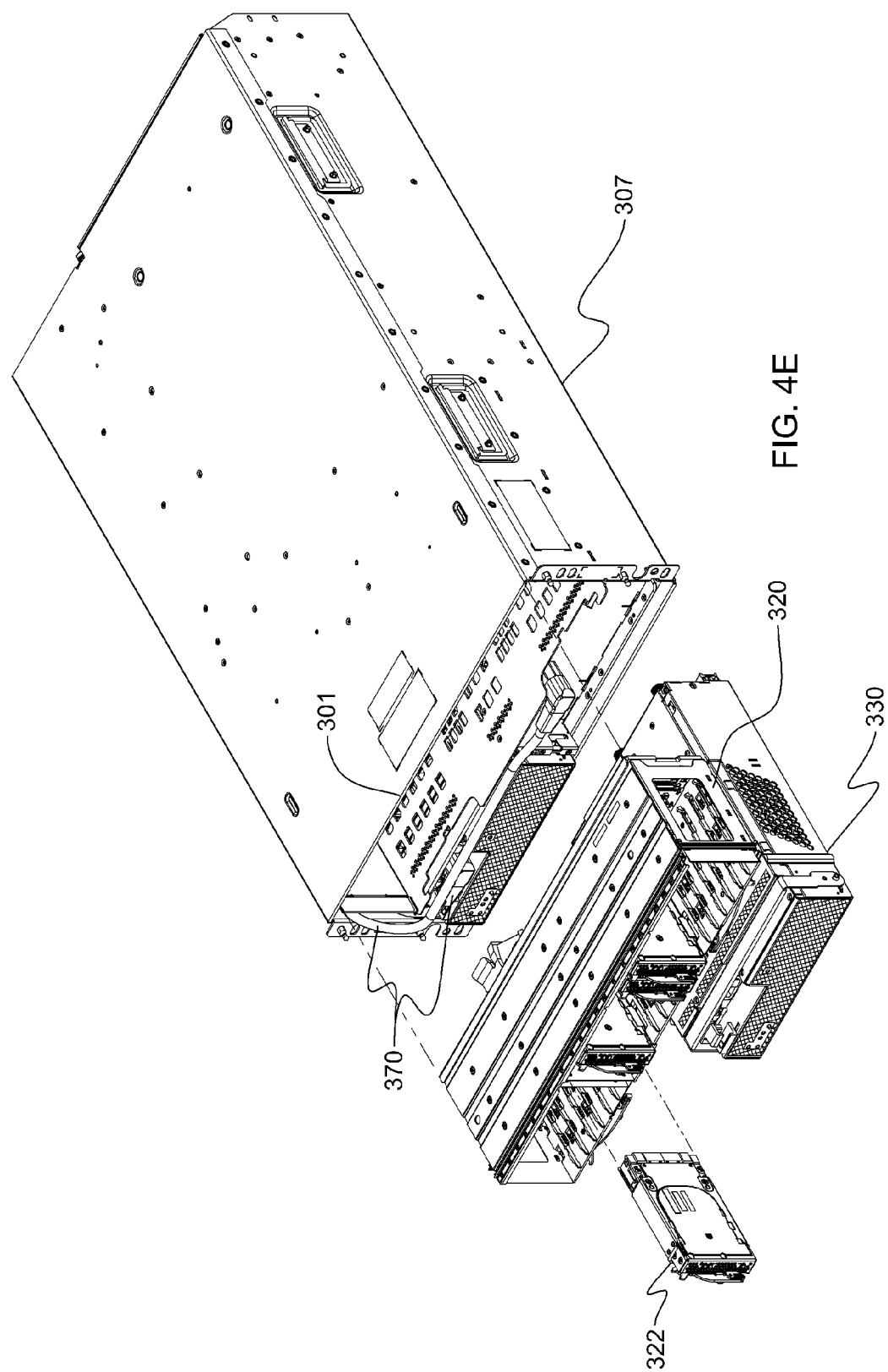
FIG. 4E is a front isometric view of the I/O and disk expansion subsystem of FIGS. 4A-4D, and illustrating multiple power and control supplies and a storage device cage accessible and removable from the front side of the subsystem enclosure, in accordance with an aspect of the present invention.

FIG. 4E illustrates front side 301 of I/O and disk expansion subsystem enclosure 307, with one power and control supply 330 shown operatively positioned therein and electrically connected to an AC line cord 370, and a second power and control supply 330 removed from the enclosure. Additionally, one embodiment of storage device cage 320 is illustrated being positioned over power and control supplies 330. A port expander card 322 is shown exploded from storage device cage 320. As noted above, in one example, storage device cage 320 is a direct access storage device (DASD) cage.

Figure 4F:
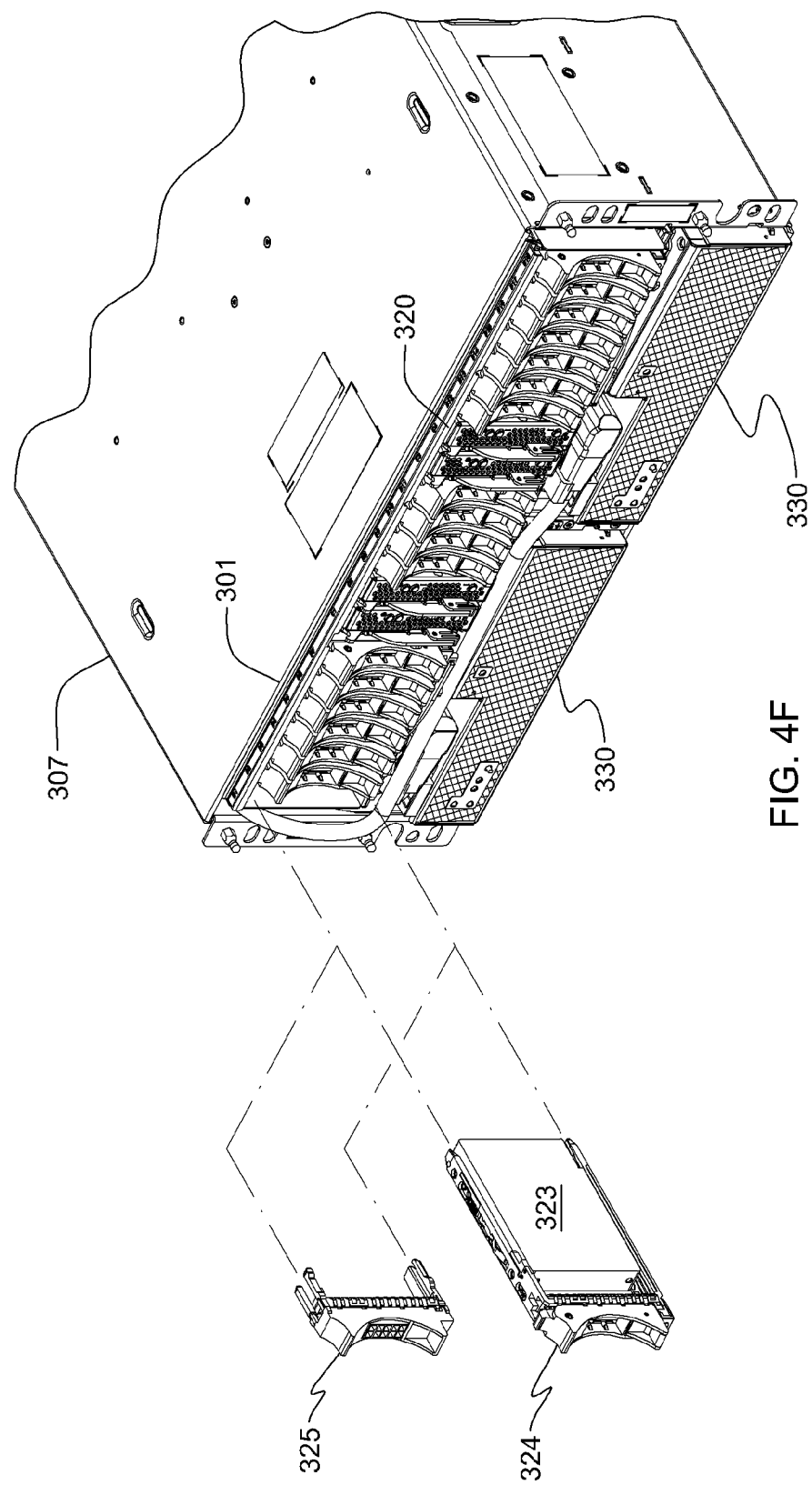
FIG. 4F depicts a partial front isometric view of the I/O and disk expansion subsystem enclosure of FIGS. 4A-4E, and illustrating insertion of a storage device into the storage device cage operatively positioned within the subsystem enclosure, in accordance with an aspect of the present invention.

FIG. 4F illustrates front side 301 of I/O and disk expansion subsystem enclosure 307 with the power and control supplies 330 and storage device cage 320 operatively positioned within the expansion subsystem enclosure. In this figure, a disk drive 323 and associated disk drive carrier 324 are illustrated removed from storage device cage 320. The latch on disk drive carrier 324 cams and locks the carrier into storage device cage 320. The dotted lines illustrate how it docks into a corresponding slot in the storage device cage. The other exploded component is one example of a storage device filler 325, and there is a latch on storage device filler 325 that cams and locks this component into the storage device cage as well. All disk drive bays in the storage device cage are assumed to be populated with either a functional disk drive 323 or a storage device filler 325, which is employed to balance airflow and provide an electromagnetic seal to the I/O and disk expansion subsystem enclosure 307.

Figure 5A:
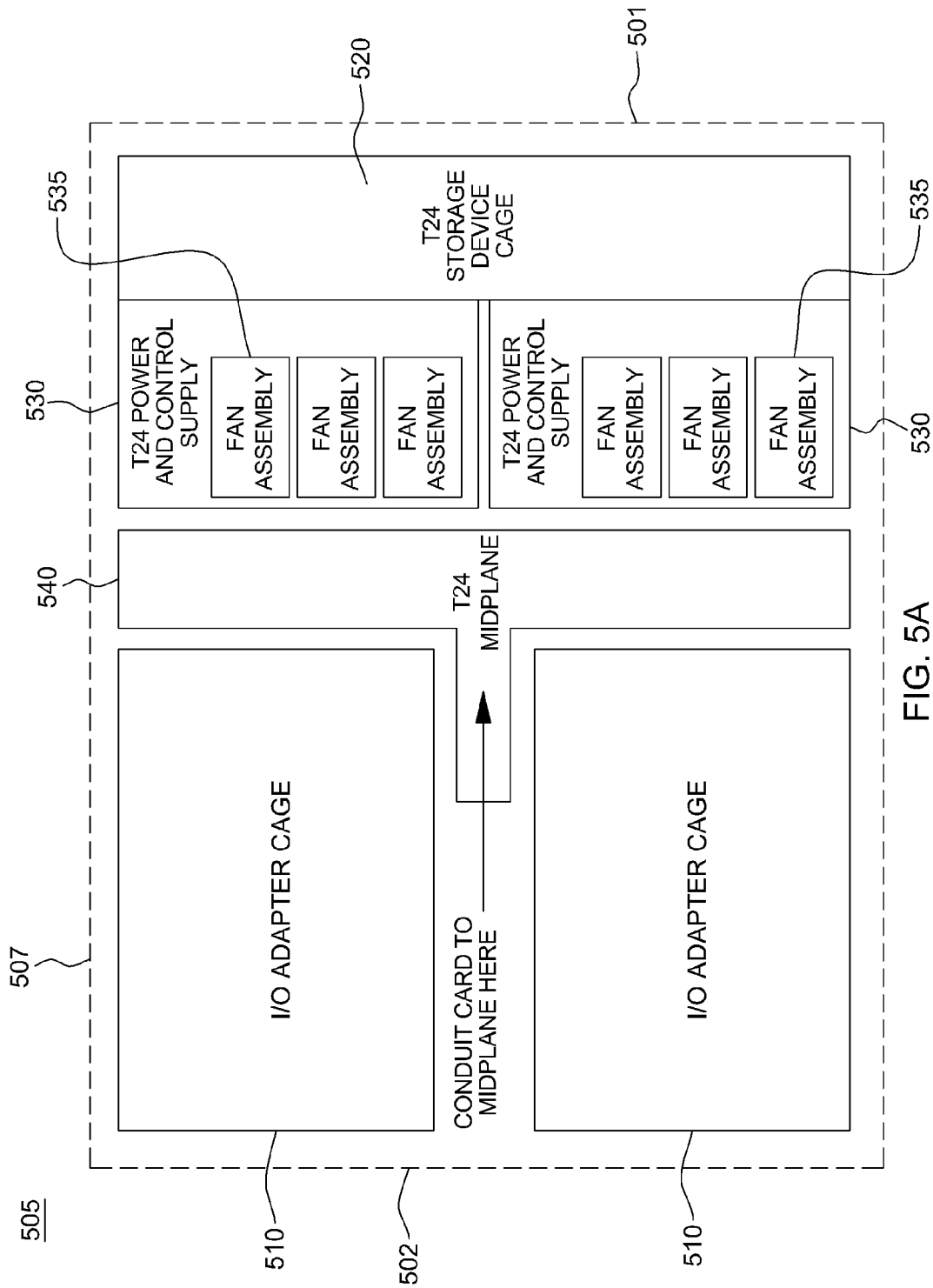
FIG. 5A is a simplified plan view of another embodiment of an I/O and disk expansion subsystem for an electronics rack, in accordance with an aspect of the present invention.
Figure 5B:
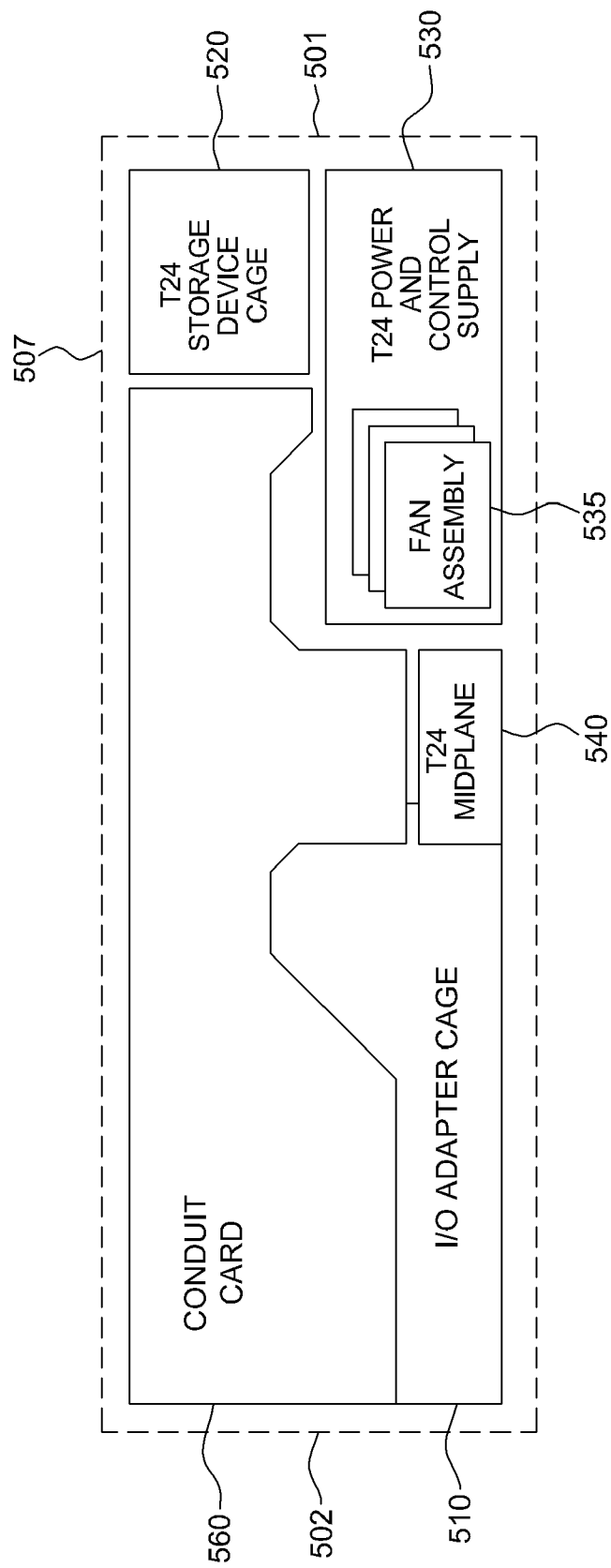
FIG. 5B is an elevational view of the I/O and disk expansion subsystem of FIG. 5A, in accordance with an aspect of the present invention.

FIGS. 5A & 5B depict one embodiment of an I/O and disk expansion subsystem 505 for a 24-inch electronics rack, which can employ (in one embodiment) various field-replaceable units from the 19-inch version of the I/O and disk expansion subsystem described above.

The I/O and disk expansion subsystem 505 includes an I/O and disk expansion subsystem enclosure 507 having a front side 501 and a back side 502, two input/output adapter cages 510, a T24 storage device cage 520, two T24 power and control supplies 530, each of which includes three fan assemblies 535, a T24 midplane connector card 540, and a conduit card 560. In one embodiment, the input/output adapter cages 510, fan assemblies 535, and conduit card 560 are identical to the input/output adapter cage 310, fan assemblies 335, and conduit card 360 described above in connection with the I/O and disk expansion subsystem of FIGS. 3A-4F.

Specific building blocks for the 24-inch version of the I/O and disk expansion subsystem include T24 storage device cage 520, T24 power and control supplies 530 and T24 midplane connector card 540. Storage device cage 520 is, in one example, a DASD cage which includes a printed circuit board housed in a mechanical cage that offers 26 SAS SFF disk drive bays and four slots for port expander cards. The T24 storage device cage connects the port expander cards electrically with SAS wires to the disk drives within the cage, and also connects the port expander cards to SAS wires coming from conduit card 560. Each T24 power and control supply 530 converts (by way of example) 350V DC input power within the rack into the DC voltage levels required by the expansion subsystem. In addition, it has a microprocessor that communicates to and controls other building blocks within the subsystem enclosure. The power and control supply turns ON soft switches to components within the building blocks, initializes chips and releases them from reset, controls the fan speeds, reads part numbers and EC information, and other control functions. Each power and control supply houses three fan assemblies 535, which as noted, are (in one embodiment) identical to fan assemblies 335.

Two T24 power and control supplies are employed in the expansion subsystem for redundancy, each of which itself can power and control the entire I/O and disk expansion subsystem. For a 24-inch electronics rack, the bulk power assembly within the rack accepts utility power and converts it to 350V DC, which is then distributed to each enclosure within the rack. Each T24 power and control supply 530 accepts this 350V input power and generates the necessary DC voltage levels for the enclosure. In one specific example of a expansion subsystem 505, this includes 12V and 5V to SAS SFF disk drives, as well as 12V and 3.3V to PCIe input/output adapter slots. Also, several other voltages, including 1.2V, 1.5V and 1.8V may be required for bridge chips and expander chips, noted in the PCIe cage and port expander descriptions provided herein. Each T24 power and control supply has two 350V power connectors. The 350V power cables (not shown) that plug to these connectors have built-in control signals. In the case of the 24-inch expansion subsystem 505, the subsystem can be controlled by the data center through the bulk power assembly in the rack, via this connection and the 350V power cable. For a 24-inch electronics rack, there is space next to the electronic subsystems, including the I/O and disk expansion subsystem, to run the 350V power cables, so a DC power cable channel through the enclosure is not required. Another embodiment of the power and control supply could include a standard interface, such as an Ethernet interface, in the 350V power cables in order to facilitate control of the expansion subsystem.

T24 midplane connector card 540 is analogous to T19 midplane connector card 340 (see FIGS. 3A & 3B). T24 power and control supplies 530 plug into T24 midplane connector card 540, which distributes the DC power and control signals from the power and control supplies 530 to the input/output adapter cages 510, the storage device cage 520, and other circuitry within the subsystem enclosure. Conduit card 560 and the input/output adapter cages also dock to (or plug into) T24 midplane connector card 540.

FIGS. 6A-6G depict one detailed embodiment of an I/O and disk expansion subsystem for a conventional 24-inch wide electronics rack. This detailed example implements the simplified I/O and disk expansion subsystem illustrated in FIGS. 5A & 5B.

Figure 6A:
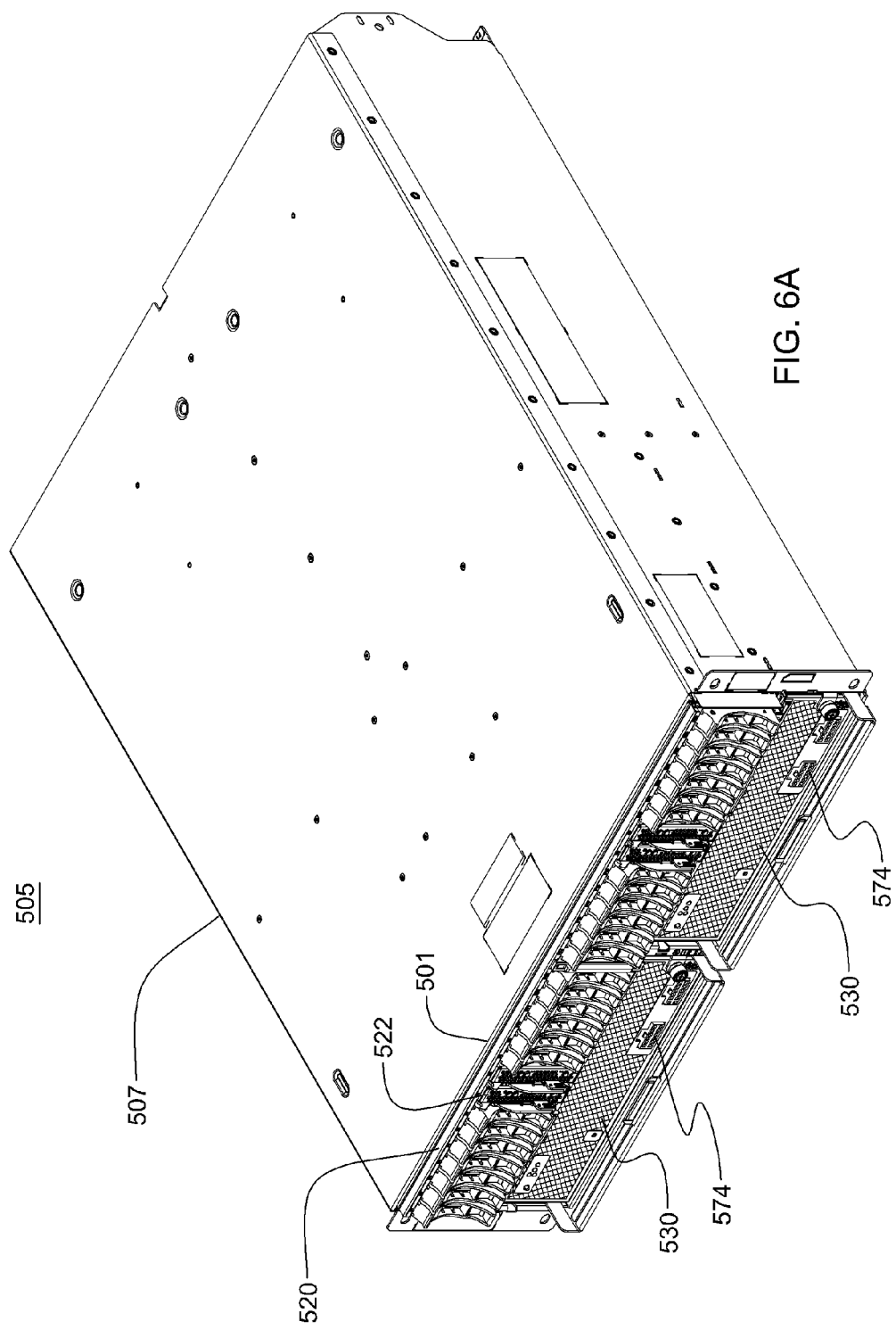
FIG. 6A is a detailed front isometric view of the I/O and disk expansion subsystem depicted in FIGS. 5A & 5B, in accordance with an aspect of the present invention.

Referring to FIG. 6A, one embodiment of the I/O and disk expansion subsystem 505 is illustrated from front side 501. I/O and disk expansion subsystem 505 includes an I/O and disk expansion subsystem enclosure 507 which accepts and houses the building blocks of the subsystem illustrated in FIGS. 5A & 5B. This enclosure is sized and configured to reside within, by way of example, a 24-inch electronics rack. One embodiment of a storage device cage 520 is shown. In this embodiment, the storage device cage 520 is a DASD cage which houses a total of 26 disk drives controlled by four port expander cards 522. Port expander cards 522 have expander chips which control power and SAS traffic to the disk drives. The two leftmost cards are redundant and control the 13 leftmost drive bays, while the two rightmost cards are also redundant and control the 13 rightmost drive bays. The port expander card 522 is a building block that is field-replaceable. Two power and control supplies 530 are illustrated for redundancy, each comprising a 350V DC power cable connector 574 for connecting rack power to the expansion subsystem enclosure.

Figure 6B:
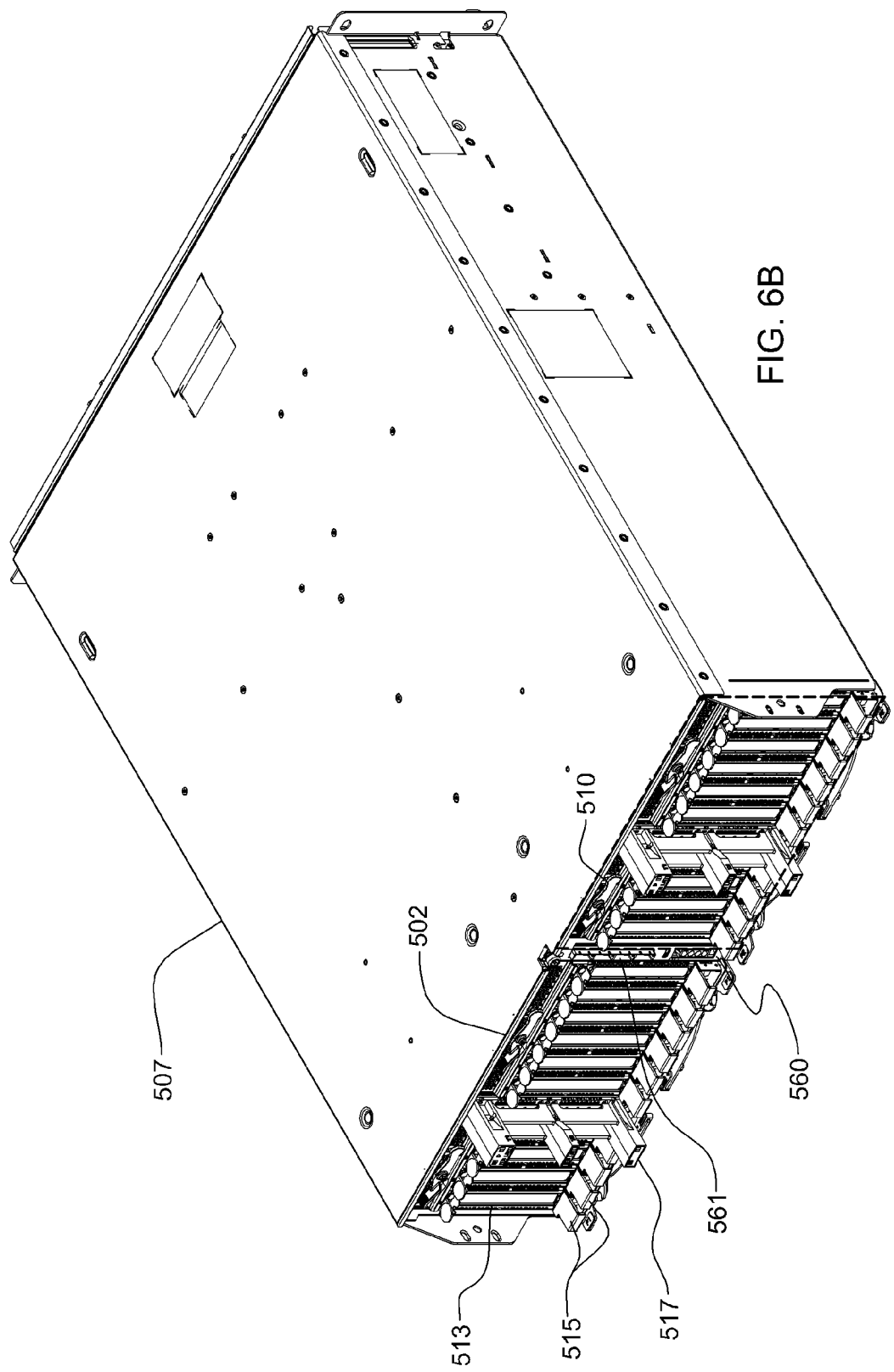
FIG. 6B is a back isometric view of the I/O and disk expansion subsystem enclosure of FIG. 6A, in accordance with an aspect of the present invention.

FIG. 6B illustrates I/O and disk expansion subsystem enclosure 507 from back side 502, and shows input/output adapter cages 510 in operative position populated with input/output adapters. In one example, the input/output adapter cages 510 are PCIe cages, which are shown installed within the subsystem enclosure. Each PCIe cage accepts blind swap cassettes 513, which are either employed as filler for airflow and electromagnetic sealing, or to house a respective PCIe card and mate it to the PCIe cage. Tabs 515 on the blind swap cassettes 513 are used to actuate the respective PCIe cards downwards to plug their edge connectors to the respective connector of the PCIe cage. Strain relieve brackets 517 and an edge of conduit card 560 are also illustrated. In one embodiment, the edge of conduit card 560 includes four SAS four-lane 3G bps ports 561.

Figure 6C:
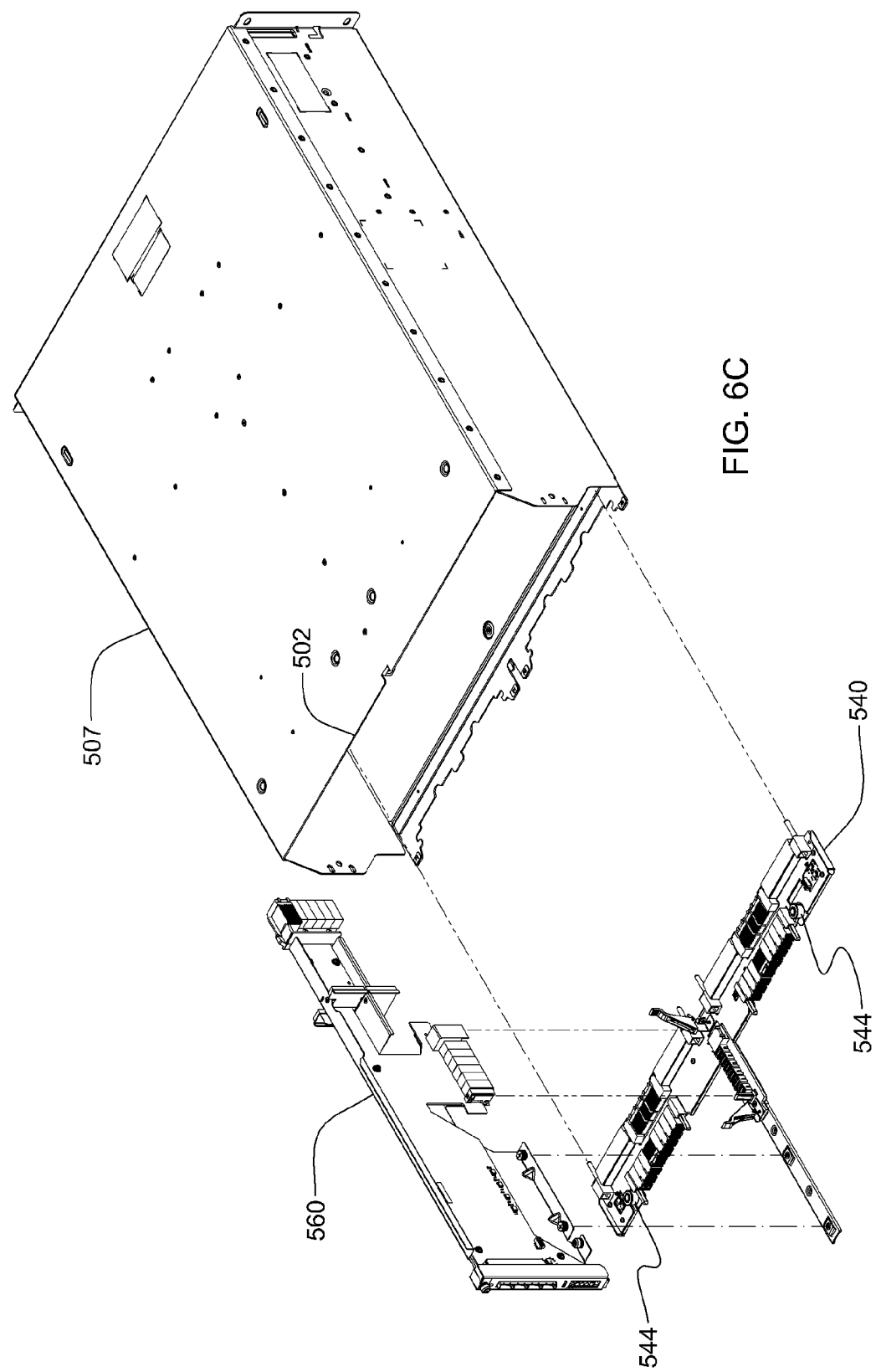
FIG. 6C is an exploded back isometric view of a partially assembled I/O and disk expansion subsystem of FIGS. 6A & 6B, showing a midplane connector assembly, in accordance with an aspect of the present invention.

FIG. 6C illustrates the midplane connector assembly, comprising midplane connector card 540 and conduit card 560, being positioned for installation within I/O and disk expansion subsystem enclosure 507 through back side 502 thereof. Conduit card 560 includes thumbscrews which secure it to midplane connector card 540, and the conduit card and midplane connector card together slide into the subsystem enclosure, as illustrated. In one assembly approach, these are the first two components to be placed into the enclosure. The input/output adapter cage, power and control supplies and storage device cage dock (or plug) into the midplane connector assembly within the enclosure. Quarter-turn plungers 544 are employed once the midplane connector card and conduit card assembly is slid into the enclosure. These quarter-turn plungers 544 are turned to allow the plunger to drop into a corresponding opening in the subsystem enclosure 507. In the embodiment illustrated, the two plungers locate and lock the midplane connector card and conduit card into position within the enclosure. Thumbscrews may also be provided at the front of the conduit card to thread the conduit card to the top side of the enclosure. As explained above, in one implementation, the input/output adapter cages are removed to allow access and removal of the midplane connector card 540 and conduit card 560. The midplane connector card 540 includes latches that assist with removal of the conduit card if either the conduit card or midplane connector card are to be replaced in the field.

Figure 6D:
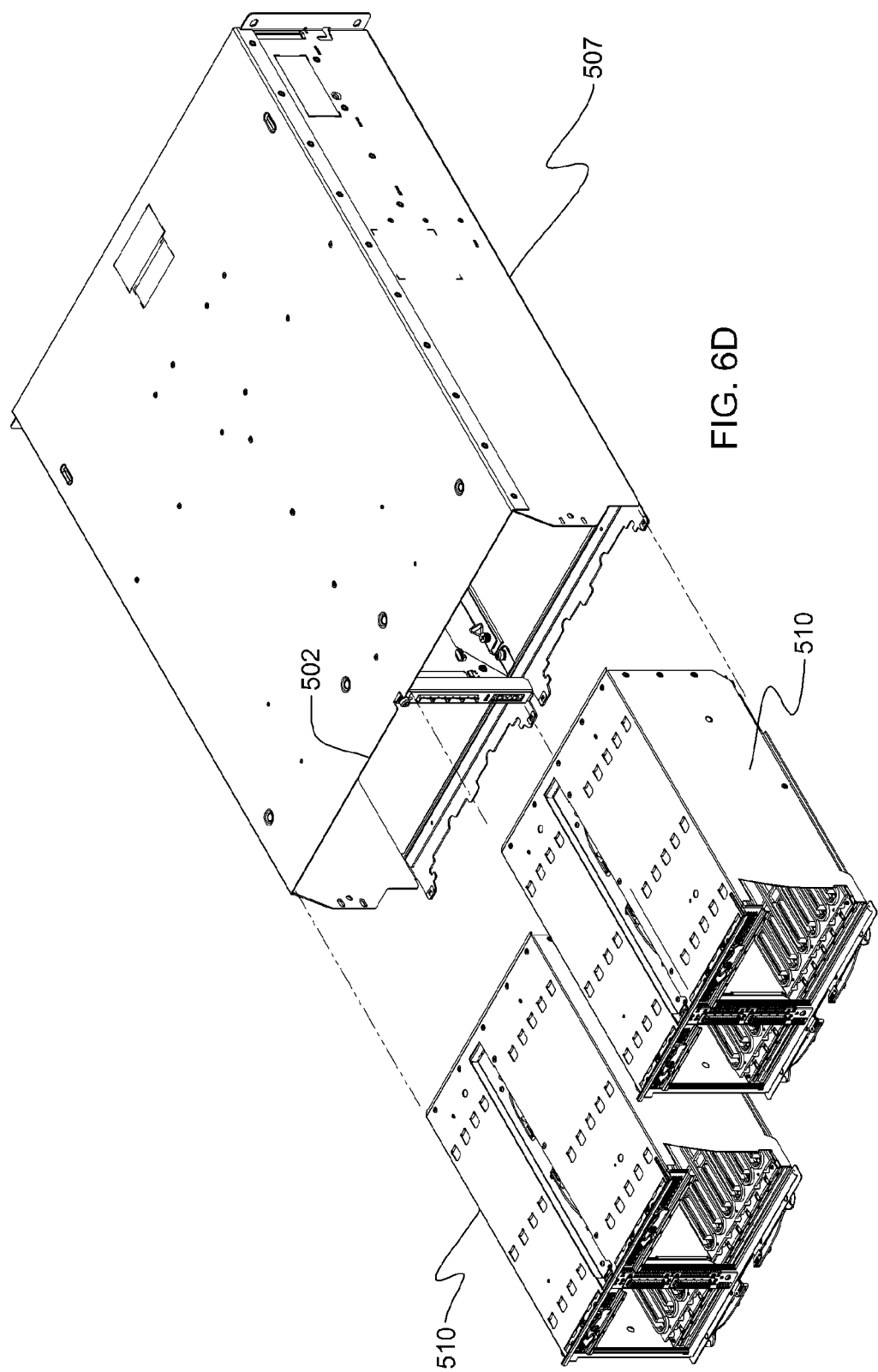
FIG. 6D is a back isometric view of the partially assembled structure of FIG. 6C, after operative positioning of the midplane connector assembly within the I/O and disk expansion subsystem enclosure, and illustrating one embodiment of input/output adapter cages accessible through the back of the I/O and disk expansion subsystem enclosure, in accordance with an aspect of the present invention.

FIG. 6D depicts the back side 502 of I/O and disk expansion subsystem enclosure 507 and illustrates insertion of the two input/output adapter cages 510 into the enclosure, after the midplane connector assembly has been operatively positioned within the enclosure.

Figure 6E:
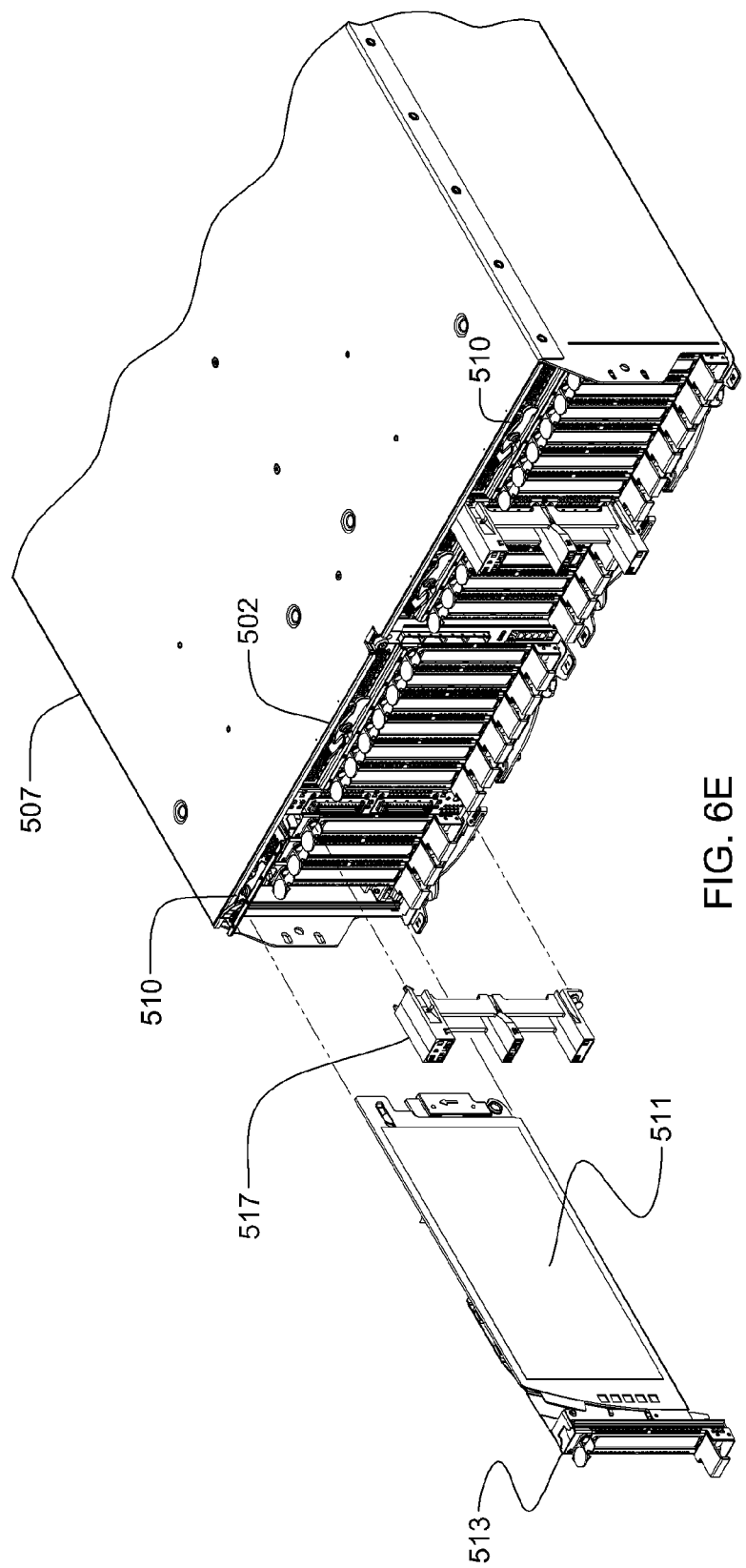
FIG. 6E is a partial back isometric view of the I/O and disk expansion subsystem enclosure of FIGS. 6A-6D, after positioning of the input/output adapter cages within the I/O and disk expansion subsystem enclosure, and illustrating one embodiment of an input/output adapter card and blind swap cassette removed from one of the input/output adapter cages, in accordance with an aspect of the present invention.

FIG. 6E illustrates back side 502 of I/O and disk expansion subsystem enclosure 507 with the input/output adapter cages 510 shown in operative position and populated with, for example, PCIe cards 511, each residing within a respective blind swap cassette 513. One blind swap cassette and PCIe card subassembly is shown exploded from the respective input/output adapter cage slot. The strain relief bracket 517 is also illustrated, which in one embodiment, is an InfiniBand cable strain relief bracket.

Figure 6F:
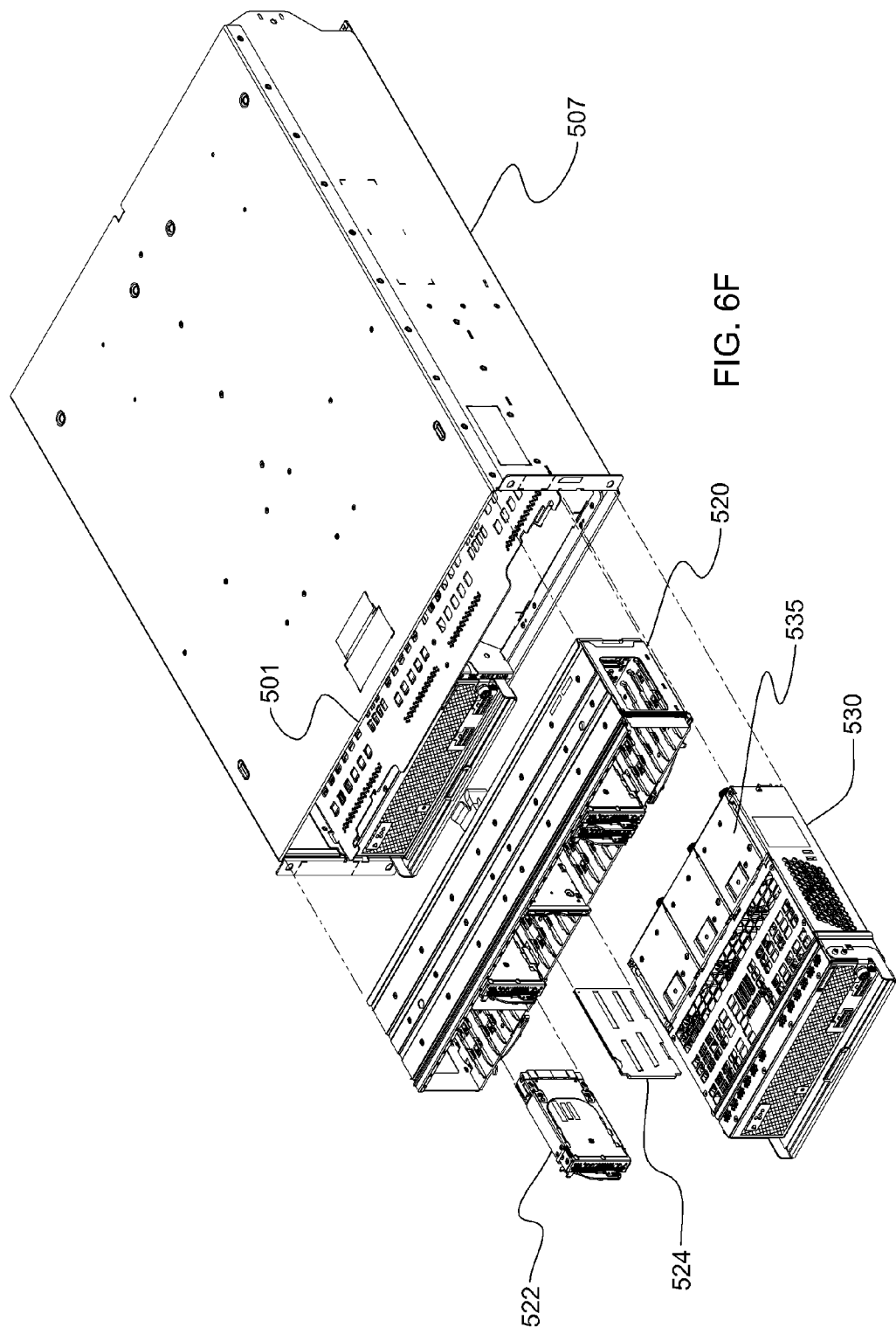
FIG. 6F is a front isometric view of the I/O and disk expansion subsystem enclosure of FIGS. 6A-6E, illustrating removed one of the power and control supplies, and the storage device cage, as well as a port expander card and a service card from the storage device cage, in accordance with an aspect of the present invention.

FIG. 6F depicts the I/O and disk expansion subsystem enclosure 507 of FIGS. 6A-6E, and illustrates the storage device cage 520 and one power and control supply 530 removed from subsystem enclosure 507. Additionally, one port expander card 522 is shown being inserted into storage device cage 520, as well as one service card 524 for which the storage device cage is configured to accommodate. In one implementation, the service card is a small set of attached, laminated, printed cardstock pages, with pictures and text, that identify key information for service personnel. The three fan assemblies 535 are illustrated as part of the removed power and control supply 530 shown in FIG. 6F.

Figure 6G:
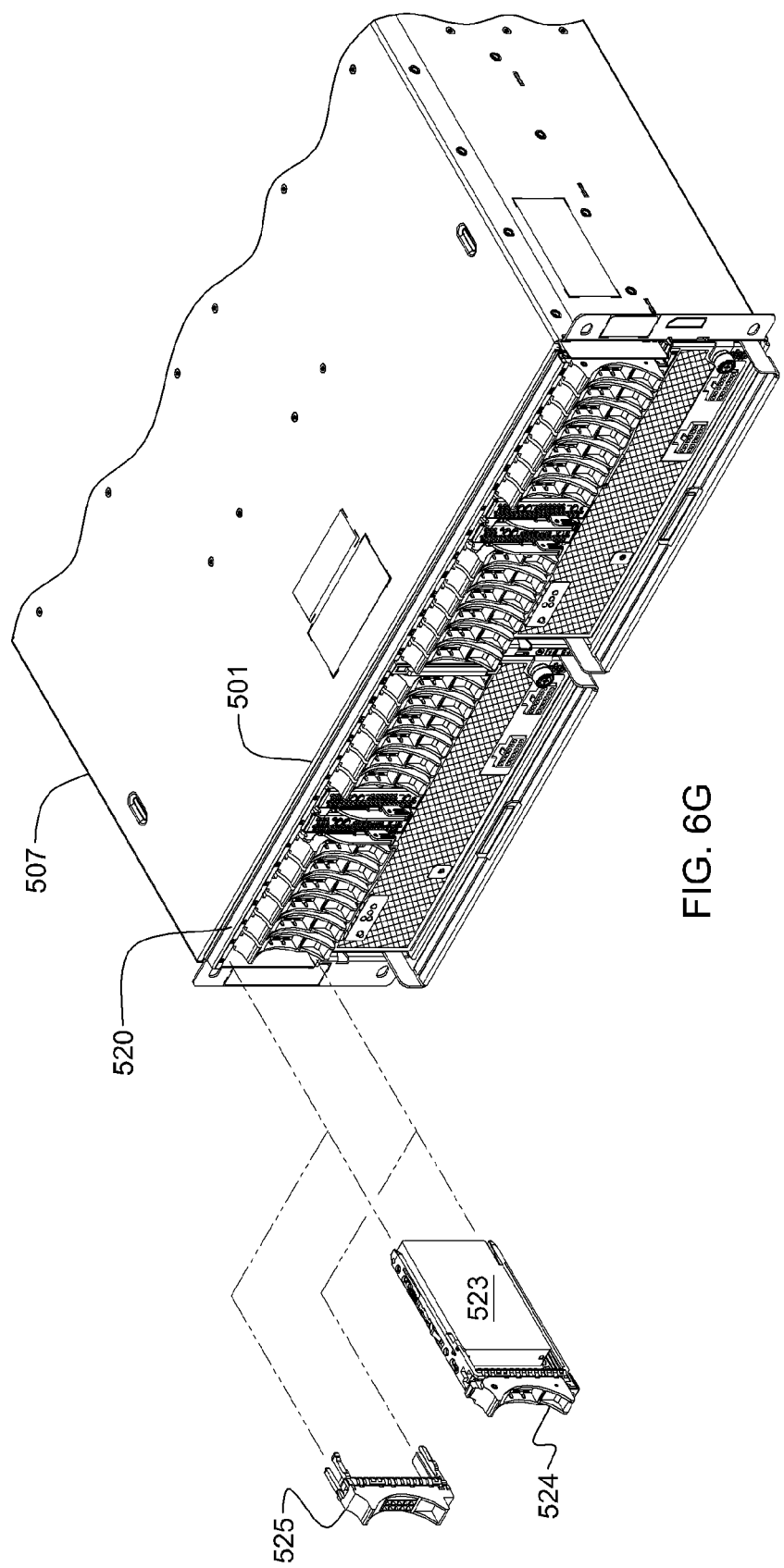
FIG. 6G is a partial front isometric view of the I/O and disk expansion subsystem enclosure of FIGS. 6A-6F, and illustrating removed a disk drive from the storage device cage, in accordance with an aspect of the present invention.

FIG. 6G illustrates the I/O and disk expansion subsystem enclosure 507 of FIGS. 6A-6F from front side 501, with the power and control supplies and storage device cage shown in operative position within the subsystem enclosure. In addition, one disk drive 523 and disk drive carrier 524 are shown removed from storage device cage 520, along with a carrier filler 525. The disk drive carrier 524 and carrier filler 525 each cam and lock into the storage device cage 520. The bays of storage device cage 520 are populated with either a functional disk drive and drive carrier subassembly, or with the carrier filler, which is desired for airflow balancing and electromagnetic sealing.

Figure 7:
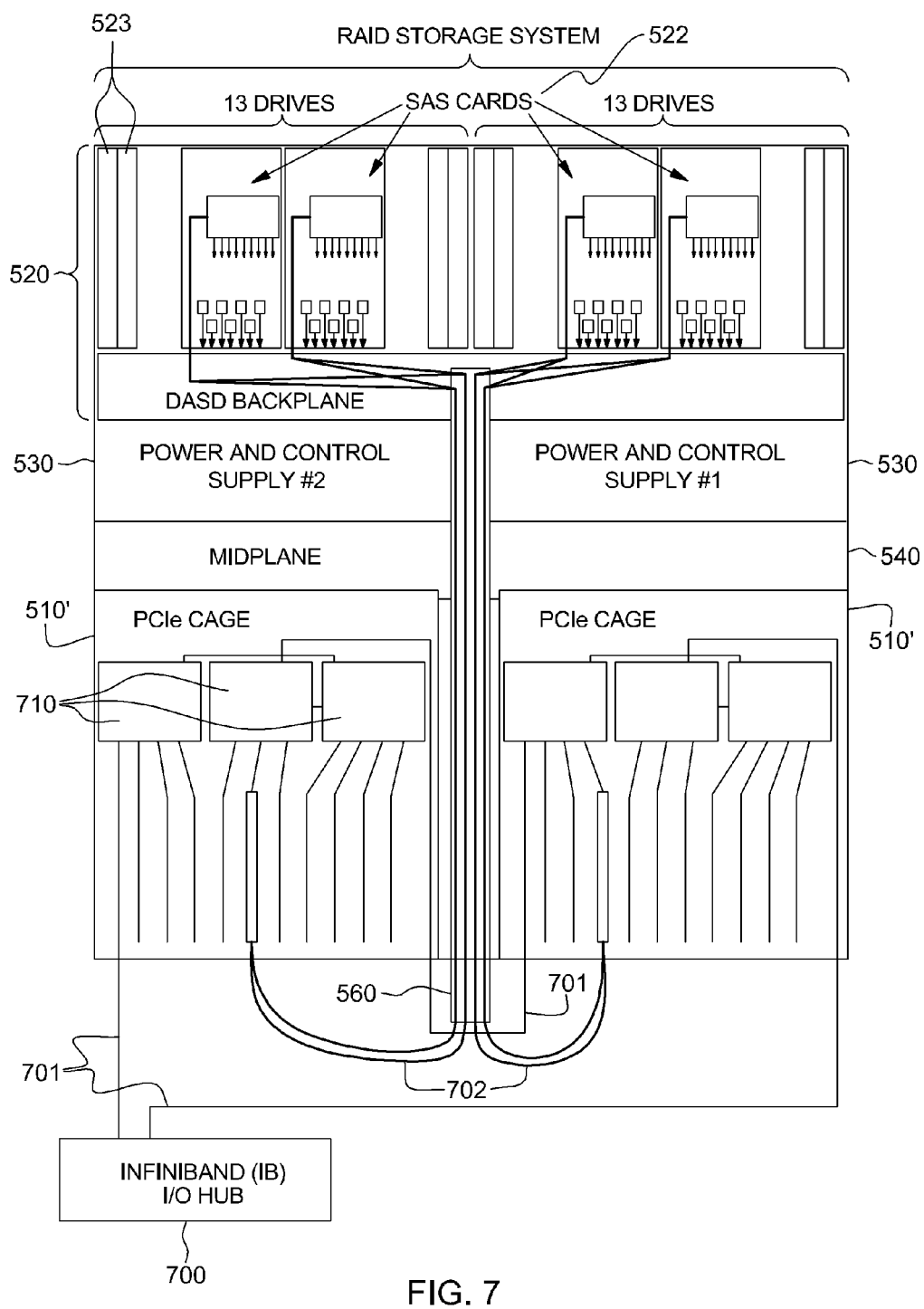
FIG. 7 is a schematic of one embodiment of electrical interconnection of various components of the I/O and disk expansion subsystem of FIGS. 5A-6G, in accordance with an aspect of the present invention.

FIG. 7 is a schematic depicting one embodiment of electrical connections of the various building blocks of the I/O and disk expansion subsystem described above in connection with FIGS. 5A-6G. Although shown for a T24 expansion subsystem enclosure, the connections are representative of both the T24 and T19 expansion subsystem enclosure, with the exception being that the enclosure management controller card docks to the midplane connector card in the T19 I/O and disk expansion subsystem of FIGS. 3A-4F.

Referring to FIG. 7, InifiniBand (IB) cables 701 are shown connected as a loop, wherein the input/output hub 700 card is assumed disposed in an electronic subsystem (not shown) of the rack which requires additional input/output and/or disk storage. As shown, this hub is connected to both PCIe cages 510. Hubs are added to the server unit to provide the amount of I/O capacity needed for a given server application. A loop topology is used to connect the expansion subsystem to the hub, enabling the expansion subsystem to operate even in the case of a failed connection, such as an unplugged cable. A loop topology also enables multiple electronic subsystems to be connected to a single hub in a loop to provide I/O capacity in excess to what can be achieved with a single enclosure per hub. With the loop topology, a break in the loop will cause traffic to be routed up to the break on either side of the loop, thereby retaining as much subsystem functionality as possible during a fault. The storage subsystem can be connected back through the I/O slots to the base server in a completely multi-path fashion, thereby eliminating any single point of failure when a RAID disk array is deployed. All elements in both the I/O adapter slot structure and the disk structure are independently fenced in the areas of signaling, power input and side band controls, thereby allowing fault containment regions to be formed. A combination of the loop I/O topology, RAID storage, and solid fault containment regions enable ultra-high resiliency of the subsystem to be achieved.

As shown in FIG. 7, the PCIe cages 510' are also connected to one another. The bridge modules 710 within the PCIe cages are connected together to complete a loop of six bridge modules. If any cable or module-to-module link is broken, all modules are still accessible from the alternate path. In one embodiment, bridge modules 710 are IB-to-PCIe bridge modules which perform protocol conversion between IB and PCIe. Cables 702 are serial-attached SCSI (SAS) cables. PCIe SAS adapters are plugged into the PCIe slots in PCIe cages 510'. These adapters are connected to conduit card 560 by SAS cables 702. As illustrated, conduit card 560 includes wires that connect SAS cables 702 at the rear of the expansion subsystem enclosure to storage device cage 520 (e.g., a 26 drive DASD cage) at the front of the enclosure. Midplane connector card 540 is also shown, into which PCIe cages 510' dock, as well as power and control supplies 530 and storage device cage 520. Storage device cage 520 is shown to include four port expander cards 522, which include industry expander chips that route SAS traffic from conduit card 560 to disk drives 523.

Those skilled in the art will note from the above description that the I/O and disk expansion subsystems disclosed herein are advantageously characterized by dense packaging, high modularity, and extreme high availability. The dense packaging includes:

- 26 SAS SFF dual access drives, 20 PCIe full height/length slots, redundant power/cooling, & redundant management controls and control networking, all fitting into the 4 EIA 24" T24 enclosure; with concurrent maintenance of most elements.
- 18 SAS SFF dual access drives, 10 PCIe full height/length slots, redundant power/cooling, & redundant management controls and control networking, all fit into the 4 EIA 19" T19 enclosure; with concurrent maintenance of most elements.
- Packaging the quantity of hardware outlined in enclosures this size, with the ability to maintain them concurrently without sliding the drawers out of the rack, and without the use of any cables; requires a very unique packaging & cooling design. The advantages gained from this novel packaging and cooling design are reduced data center physical size, simplified service, and a clean looking cable-less design.

High modularity is achieved by:
- All Building Block Field Replaceable Units (FRUs) are accessed through the front or back of the enclosure without tools, and in most cases can be "hot swapped"; i.e., they can be replaced while the expansion subsystem is operating.
  - Hot Swappable Building Block FRUs include:
    T19 and T24 Power and Control Supplies
    FAN Assemblies
      Since it rides on the power and control supply, a fan can be replaced by temporarily unplugged one power and control supply and allowing the second to maintain the expansion subsystem powered.
    PCIe Cages (in the case of T24)
    Blind Swap Cassettes
    Drive Carriers with disk drives
    EMC Card
    Port Expander Cards
  - Building Block FRUs requiring expansion subsystem power OFF for replacement include:
    Midplane Card
    Conduit Card
    Storage Device Cage
    PCIe Cage on T19 only, since there is only one Extreme high availability is achieved through:
- Deployment of fault containment domains
- Multi-pathing (InfiniBand, SAS)
- Active redundancy of selected hardware
- Fault and error checking while the expansion subsystem is operating
- Diagnostic sensing that enables predictive failure determination and integration of functions Disclosed herein are I/O and disk expansion subsystems that provide I/O slots in addition to I/O slots that may be part of a server unit within an electronics rack, along with a balanced number of storage (e.g., hard drive) bays. The subsystems are extremely modular, enabling a single set of building block types in used in cost effectively creating personalized subsystems for both 24-inch rack high-end environments, and 19-inch rack or deskside, mid-range and low-end environments. Extreme high availability of the enclosure is achieved through a multitude of techniques, including: deployment of fault containment domains, multi-pathing, active redundancy of selected hardware, fault and error checking while the enclosure is operating, diagnostic sensing that enables predictive fault determination, and integration of function. Novel physical design of the enclosure allows for high packaging density to be achieved.

The modularity in the building blocks enables complete reuse of certain components between multiple expansion subsystem applications, with examples including the entire multi-card I/O adapter cage, the I/O adapter cassettes, the conduit card, the port cards, and the hard drive carrier assemblies. In other case, modular designs enable component designs to be scaled so that most of the design effort can be reused, including drawer enclosure, midplane, disk cage and power and control supplies.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An input/output (I/O) expansion and disk expansion subsystem comprising:
   an I/O expansion and disk expansion subsystem enclosure configured for an electronics rack comprising at least one electronic subsystem to couple to the I/O expansion and disk expansion subsystem, the I/O expansion and disk expansion subsystem enclosure comprising a first side and a second side in opposing relation, the first side being accessible through a front of the electronics rack when the I/O expansion and disk expansion subsystem enclosure is positioned therein and the second side being accessible through a back of the electronics rack when the I/O expansion and disk expansion subsystem enclosure is positioned therein;

a plurality of field-replaceable units configured to reside within the I/O expansion and disk expansion subsystem enclosure, the plurality of field-replaceable units being accessible and removable through at least one of the first side or the second side of the I/O expansion and disk expansion subsystem enclosure without removing the I/O expansion and disk expansion subsystem enclosure from the electronics rack, the plurality of field-replaceable units comprising:

at least one input/output adapter cage, the at least one input/output adapter cage comprising a plurality of input/output adapter receiving slots facilitating coupling of one or more standard form factor input/output adapters to the at least one electronic subsystem of the electronics rack, the one or more input/output adapters being operatively disposed within respective input/output adapter-receiving slots of the at least one input/output adapter cage, the at least one input/output adapter cage and the one or more standard form factor I/O adapters defining an I/O expansion subsystem;

at least one storage device cage, the at least one storage device cage comprising a plurality of storage device receiving slots facilitating coupling of one or more storage devices to the at least one electronic subsystem of the electronics rack, the at least one storage device cage and the one or more storage devices defining a disk expansion subsystem;

at least one power and control supply for powering and controlling the I/O expansion and disk expansion subsystem, the at least one power and control an supply comprising at least one fan assembly for moving air within the I/O expansion and disk expansion subsystem enclosure to facilitate cooling thereof; and a midplane connector assembly, the at least one input/output adapter cage, the at least one storage device cage, and the at least one power and control supply docking to and being electrically interconnected by the midplane connector assembly within the I/O expansion and disk expansion subsystem enclosure.

2. The I/O expansion and disk expansion subsystem of claim 1, wherein the midplane connector assembly couples power and control signals to the at least one input/output adapter cage and the at least one storage device cage from the at least one power and control supply.

3. The I/O expansion and disk expansion subsystem of claim 2, wherein the midplane connector assembly comprises a midplane connector card and a conduit card, the conduit card connecting to the midplane connector card and facilitating operative coupling of storage devices within the at least one storage device cage to input/output adapters within the at least one input/output adapter cage, and wherein the one or more standard form factor input/output adapters couple to one or more blind swap cassettes which dock vertically within the one or more input/output adapter-receiving slots of the plurality of input/output adapter-receiving slots of the at least one input/output adapter cage.

4. The I/O expansion and disk expansion subsystem of claim 1, wherein the at least one storage device cage and the at least one power and control supply are each accessible and removable through the first side of the I/O expansion and disk expansion subsystem enclosure, and the at least one input/output adapter cage is accessible and removable through the second side of the I/O expansion and disk expansion subsystem enclosure.

5. The I/O expansion and disk expansion subsystem of claim 4, wherein the plurality of the field-replaceable units further comprise an AC line cord conduit facilitating bringing AC electrical power from the back of the electronics rack through the I/O expansion and disk expansion subsystem enclosure to the at least one power and control supply, the at least one power and control supply converting AC power to DC power for distribution within the I/O expansion and disk expansion subsystem enclosure via the midplane connector assembly.

6. The I/O expansion and disk expansion subsystem of claim 1, wherein the plurality of field-replaceable units comprise multiple input/output adapter cages, each input/output adapter cage comprising a plurality of input/output adapter receiving slots, wherein the input/output adapters are individually replaceable within the multiple input/output adapter cages while the I/O expansion and disk expansion subsystem remains operational, and wherein the multiple input/output adapter cages are individually replaceable within the I/O expansion and disk expansion subsystem enclosure while the I/O expansion and disk expansion subsystem remains operational.

7. The I/O expansion and disk expansion subsystem of claim 1, wherein the plurality of field-replaceable units further comprise multiple power and control supplies, each power and control supply comprising at least one fan assembly for moving air within the I/O expansion and disk expansion subsystem enclosure to facilitate cooling thereof, and wherein the multiple power and control supplies are individually replaceable within the I/O expansion and disk expansion subsystem enclosure while the I/O expansion and disk expansion subsystem remains operational.

8. The I/O expansion and disk expansion subsystem of claim 7, wherein the at least one fan assembly of each power and control supply is accessible and removable from the I/O expansion and disk expansion subsystem enclosure while the I/O expansion and disk expansion subsystem remains operational and air is moved within the I/O expansion and disk expansion subsystem enclosure by at least one fan assembly of at least one other power and control supply remaining operational within the I/O expansion and disk expansion subsystem enclosure, and wherein the fan assemblies are disposed within the I/O expansion and disk expansion enclosure adjacent to the midplane connector assembly.

9. The I/O and expansion disk expansion subsystem of claim 1, wherein the one or more storage devices comprise a plurality of direct access storage devices and multiple port expander cards, and wherein the plurality of direct access storage devices are individually replaceable within the at least one storage device cage while the I/O expansion and disk expansion subsystem remains operational, and the multiple port expander cards are individually replaceable within the at least one storage device cage while the I/O expansion and disk expansion subsystem remains operational.

10. The I/O expansion and disk expansion subsystem of claim 1, wherein the electronics rack is a conventional 24-inch wide electronics rack, and wherein the plurality of field-replaceable units comprise two input/output adapter cages, each comprising 10 input/output adapter receiving slots for receiving 10 PCIe input/output adapters, two power and control supplies, each power and control supply comprising at least one fan assembly for moving air within the I/O expansion and disk expansion subsystem enclosure, and wherein the at least one storage device cage accommodates 26 SAS SFF disk drives.

11. The I/O expansion and disk expansion subsystem of claim 1, wherein the electronics rack is a conventional 19-inch wide electronics rack, and wherein the plurality of field-replaceable units include two power and control supplies, each power and control supply comprising at least one fan assembly for moving air within the I/O expansion and disk expansion subsystem enclosure, and wherein the at least one input/output adapter cage comprises 10 input/output receiving slots for receiving 10 PCIe input/output adapters, and the at least one storage device cage accommodates 18 SAS SFF disk drives.

12. An electronics rack comprising:
    at least one electronic subsystem;
    an input/output (I/O) expansion and disk expansion subsystem coupled to the at least one electronic subsystem, the I/O expansion and disk expansion subsystem comprising:
        an I/O expansion and disk expansion subsystem enclosure comprising a first side and a second side in opposing relation, the first side being accessible through a front of the electronics rack and the second side being accessible through a back of the electronics rack;
        a plurality of field-replaceable units configured to reside within the I/O expansion and disk expansion subsystem enclosure, the plurality of field-replaceable units being accessible and removable through at least one of the first side or the second side of the I/O expansion and disk expansion subsystem enclosure without removing the I/O expansion disk expansion subsystem enclosure from the electronics rack, the plurality of field-replaceable units comprising:
            at least one input/output adapter cage, the at least one input/output adapter cage comprising a plurality of input/output adapter receiving slots facilitating coupling of one or more standard form factor input/output adapters to the at least one electronic subsystem of the electronics rack, the one or more input/output adapters being operatively disposed within respective input/output adapter-receiving slots of the at least one input/output adapter cage, the at least one input/output adapter cage and the one or more standard form factor I/O adapters defining an I/O expansion subsystem;
            at least one storage device cage, the at least one storage device cage comprising a plurality of storage device receiving slots facilitating coupling, of one or more storage devices to the at least one electronic subsystem of the electronics rack, the at least one storage device cage and the one or more storage devices defining a disk expansion subsystem;
            at least one power and control supply for powering and controlling the I/O expansion and disk expansion subsystem, the at least one power and control supply comprising at least one fan assembly for moving air within the I/O expansion and disk expansion subsystem enclosure to facilitate cooling thereof; and
            a midplane connector assembly, the at least one input/output adapter cage, the at least one storage device cage, and the at least one power and control supply docking to and being electrically interconnected by the midplane connector assembly within the I/O expansion and disk expansion subsystem enclosure.

13. The electronics rack of claim 12, wherein the at least one storage device cage and the at least one power and control supply are each accessible and removable through the first side of the I/O expansion and disk expansion subsystem enclosure, and wherein the at least one input/output adapter cage is accessible and removable through the second side of the I/O expansion and disk expansion subsystem enclosure.

14. The electronics rack of claim 12, wherein the plurality of field-replaceable units comprise multiple input/output adapter cages, each input/output adapter cage comprising a plurality of input/output adapter receiving slots, wherein the input/output adapters are individually replaceable within the multiple input/output adapter cages while the I/O expansion and disk expansion subsystem remains operational, and wherein the multiple input/output adapter cages are individually replaceable within the I/O expansion and disk expansion subsystem enclosure while the I/O expansion and disk expansion subsystem remains operational, and wherein the one or more standard form factor input/output adapters couple to one or more blind swap cassettes which dock vertically within the one or more input/output adapter-receiving slots of the plurality of input/output adapter-receiving slots of the at least one input/output adapter cage.

15. The electronics rack of claim 12, wherein the plurality of field-replaceable units further comprise multiple power and control supplies, each power and control supply comprising at least one fan assembly for moving air within the I/O expansion and disk expansion subsystem enclosure to facilitate cooling thereof, and wherein the multiple power and control supplies are individually replaceable within the I/O expansion and disk expansion subsystem enclosure while the I/O expansion and disk expansion subsystem remains operational.

16. The electronics rack of claim 15, wherein the at least one fan assembly of each power and control supply is accessible and removable with removal of the power and control supply from the I/O expansion and disk expansion subsystem enclosure while the I/O expansion and disk expansion subsystem remains operational and air is moved within the I/O expansion and disk expansion subsystem enclosure by at least one fan assembly of at least one other power and control supply remaining operational within the I/O expansion and disk expansion subsystem enclosure.

17. The electronics rack of claim 12, wherein the one or more storage devices comprise a plurality of direct access storage devices and multiple port expander cards, and wherein the plurality of direct access storage devices are individually replaceable within the at least one storage device cage while the I/O expansion and disk expansion subsystem remains operational, and the multiple port expander cards are individually replaceable within the at least one storage device cage while the I/O expansion and disk expansion subsystem remains operational.

18. The electronics rack of claim 12, wherein the electronics rack is a conventional 24-inch wide electronics rack, and wherein the plurality of field-replaceable units comprise two input/output adapter cages, each comprising 10 input/output adapter receiving slots for receiving 10 PCIe input/output adapters, two power and control supplies, each power and control supply comprising at least one fan assembly for moving air within the I/O and disk expansion subsystem enclosure, and wherein the at least one storage device cage accommodates 26 SAS SFF disk drives.

19. The electronics rack of claim 12, wherein the electronics rack is a conventional 19-inch wide electronics rack, and wherein the plurality of field-replaceable units include two power and control supplies, each power and control supply comprising at least one fan assembly for moving air within the I/O expansion and disk expansion subsystem enclosure, and wherein the at least one input/output adapter cage comprises 10 input/output receiving slots for receiving 10 PCIe input/output adapters, and the at least one storage device cage accommodates 18 SAS SFF disk drives.

20. A method of manufacturing multiple input/output (I/O) expansion and disk expansion subsystems for different-sized electronics racks, the method comprising:

providing a first I/O expansion and disk expansion subsystem enclosure comprising a first I/O expansion and disk expansion subsystem, the first I/O expansion and disk expansion subsystem enclosure being configured for a first electronics rack of the multiple different-sized electronics racks, the first electronics rack comprising at least one electronic subsystem requiring expanded input/output or device storage, the first I/O expansion and disk expansion subsystem enclosure including a first side and a second side in opposing relation, the first side being accessible through a front of the first electronics rack when the first I/O expansion and disk expansion subsystem enclosure is positioned therein and the second side being accessible through a back of the first electronics rack when the first I/O expansion and disk expansion subsystem enclosure is positioned therein;

providing a second I/O expansion and disk expansion subsystem enclosure comprising a second I/O expansion and disk expansion subsystem, the second I/O expansion and disk expansion subsystem enclosure being configured for a second electronics rack comprising at least one electronic subsystem requiring expanded input/output or device storage, the second I/O expansion and disk expansion subsystem enclosure comprising a first side and a second side in opposing relation, the first side being accessible through a front of the second electronics rack when the second I/O expansion and disk expansion subsystem enclosure is positioned therein and the second side being accessible through a back of the second electronics rack when the second I/O expansion and disk expansion subsystem enclosure is positioned therein, wherein the first electronics rack and the second electronics rack are differently-sized electronics racks, and the first I/O expansion and disk expansion subsystem enclosure and the second I/O expansion and disk expansion subs stem enclosure are differently sized and differently configured enclosures;

providing a plurality of field-replaceable units configured to reside within both the first I/O expansion and disk expansion subsystem enclosure and the second I/O expansion and disk expansion subsystem enclosure, the plurality of field-replaceable units being accessible and removable through at least one of the first side or the second side of the respective first or second I/O expansion and disk expansion subsystem enclosure when operatively positioned therein without removing the respective first or second I/O expansion and disk expansion subsystem enclosure from the associated first or second electronics rack, the plurality of field-replaceable units comprising:

at least one input/output adapter cage, the at least one input/output adapter cage comprising a plurality of input/output adapter receiving slots for facilitating coupling of one or more standard form factor input/output adapters to the at least one electronic subsystem of the associated first or second electronics rack, the one or more input/output adapters being operatively disposed within a respective input/output adapter-receiving slot of the at least one input/output adapter cage, the at least one input/output adapter cage and the one or more standard form factor I/O adapters defining an I/O expansion subsystem;

a fan assembly configured to reside within at least one power and control supply powering and electrically interconnecting components of the respective first or second I/O expansion and disk expansion subsystem, the fan assembly moving air within the respective first or second expsion and disk expansion subsystem enclosure when operatively inserted therein to facilitate cooling thereof; and a conduit card facilitating distribution of power and control signals between a midplane connector card and at least one storage device cage of the respective first or second I/O expansion and disk expansion system enclosure.

* * * * *